(12) United States Patent
Takahashi et al.

(10) Patent No.: US 12,308,181 B2
(45) Date of Patent: May 20, 2025

(54) CAPACITOR ELEMENT, MODULE, AND SEMICONDUCTOR COMPOSITE DEVICE

(71) Applicant: Murata Manufacturing Co., Ltd., Nagaokakyo (JP)

(72) Inventors: Akitomo Takahashi, Nagaokakyo (JP); Takeshi Furukawa, Nagaokakyo (JP); Koshi Himeda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/618,058

(22) Filed: Mar. 27, 2024

(65) Prior Publication Data
US 2024/0242892 A1 Jul. 18, 2024

Related U.S. Application Data

(63) Continuation of application No. PCT/JP2022/034975, filed on Sep. 20, 2022.

(30) Foreign Application Priority Data

Sep. 29, 2021 (JP) .................................. 2021-159211
Jul. 22, 2022 (JP) .................................. 2022-117376

(51) Int. Cl.
*H01G 9/012* (2006.01)
*H01G 9/28* (2006.01)
*H01L 23/498* (2006.01)
*H01G 9/055* (2006.01)
*H01G 9/10* (2006.01)
*H02M 3/00* (2006.01)

(52) U.S. Cl.
CPC ............... *H01G 9/012* (2013.01); *H01G 9/28* (2013.01); *H01L 23/49827* (2013.01);
(Continued)

(58) Field of Classification Search
CPC .......... H01G 9/012; H01G 9/28; H01G 9/055; H01G 9/10; H01G 9/15; H01G 9/048;
(Continued)

(56) References Cited

U.S. PATENT DOCUMENTS

| | | | |
|---|---|---|---|
| 6,917,514 B2 | 7/2005 | Mido et al. | |
| 8,704,454 B2* | 4/2014 | Hopper | H05K 1/165 |
| | | | 315/229 |
| 2005/0047062 A1 | 3/2005 | Mido et al. | |

FOREIGN PATENT DOCUMENTS

| JP | H07-235632 A | 9/1995 |
|---|---|---|
| JP | 2004055794 A | 2/2004 |

(Continued)

OTHER PUBLICATIONS

International Search Report received for PCT Patent Application No. PCT/JP2022/034975, mailed on Dec. 20, 2022, 2 pages (English Translation Only).

(Continued)

*Primary Examiner* — Karen Kusumakar
(74) *Attorney, Agent, or Firm* — ArentFox Schiff LLP

(57) ABSTRACT

A capacitor element that includes: a capacitor portion including an anode plate having a porous portion on a core portion, a dielectric layer on the porous portion, and a cathode layer on the dielectric layer; a first cathode through conductor and a second cathode through conductor each penetrating the dielectric layer and the anode plate in a thickness direction and electrically connected to the cathode layer; and an anode through conductor penetrating the dielectric layer and the anode plate in the thickness direction and electrically connected to the anode plate, wherein, in a plan view from a thickness direction of the anode plate, a first center-to-center distance between the first anode through conductor and the first cathode through conductor is equivalent to a second center-to-center distance between the first anode through conductor and the second cathode through conductor.

25 Claims, 16 Drawing Sheets

(52) U.S. Cl.
CPC ............... *H01G 9/055* (2013.01); *H01G 9/10* (2013.01); *H02M 3/003* (2021.05)

(58) Field of Classification Search
CPC .............................. H01G 2/06; H01G 4/228; H01G 4/33; H01G 9/14; H01G 9/26; H01L 23/49827; H02M 3/003; H02M 3/156; G05F 1/56
See application file for complete search history.

(56) References Cited

FOREIGN PATENT DOCUMENTS

| | | | |
|---|---|---|---|
| JP | 2006-011753 A | | 1/2006 |
| JP | 2006165152 A | | 6/2006 |
| JP | 2007-173439 A | | 7/2007 |
| JP | 2008/078301 | * | 4/2008 |
| JP | 2008-078301 A | | 4/2008 |
| JP | 2008098487 A | | 4/2008 |
| JP | 2008-250396 A | | 10/2008 |
| JP | 2008-288225 A | | 11/2008 |
| JP | 2009-206402 A | | 9/2009 |
| JP | 2012-114172 A | | 6/2012 |
| JP | 2020-167361 A | | 10/2020 |

OTHER PUBLICATIONS

International Search Report issued in PCT/JP2023/026760, date of mailing Aug. 22, 2023 (English language version).

* cited by examiner

CAPACITOR ELEMENT, MODULE, AND SEMICONDUCTOR COMPOSITE DEVICE

CROSS REFERENCE TO RELATED APPLICATIONS

The present application is a continuation of International application No. PCT/JP2022/034975, filed Sep. 20, 2022, which claims priority to Japanese Patent Application No. 2021-159211, filed Sep. 29, 2021, and Japanese Patent Application No. 2022-117376, filed Jul. 22, 2022, the entire contents of each of which are incorporated herein by reference.

TECHNICAL FIELD

The present disclosure relates to a capacitor element, a module, and a semiconductor composite device.

BACKGROUND ART

Patent Document 1 discloses a capacitor array including a plurality of solid electrolytic capacitor elements formed by dividing one solid electrolytic capacitor sheet, a first sealing layer having a sheet shape, and a second sealing layer having a sheet shape. The solid electrolytic capacitor sheet includes an anode plate made of a valving metal, a porous layer provided on at least one main surface of the anode plate, a dielectric layer provided on a surface of the porous layer, and a cathode layer including a solid electrolyte layer provided on a surface of the dielectric layer, and includes a first main surface and a second main surface that are opposed to each other in a thickness direction. The first main surface side of each of the plurality of solid electrolytic capacitor elements is disposed on the first sealing layer. The second sealing layer is disposed so as to cover the plurality of solid electrolytic capacitor elements on the first sealing layer from the second main surface side. The solid electrolytic capacitor elements are divided from each other by a sheet removal portion having a slit shape.

Patent Document 1: Japanese Unexamined Patent Application Publication No. 2020-167361

SUMMARY OF THE DISCLOSURE

Patent Document 1 describes that it is preferable that a through electrode penetrating the first sealing layer or the second sealing layer in the thickness direction be provided, and the anode plate or the cathode layer be connected to an outer electrode through the through electrode. For example, Patent Document 1 describes a structure in which anodes and cathodes are arranged in a staggered lattice pattern and the anode plate is directly connected to an anode through electrode on a wall surface of the anode through electrode in FIG. 22A and FIG. 22B.

However, the capacitor array described in Patent Document 1 has room for improvement in terms of reducing an equivalent series resistance (ESR) and an equivalent series inductance (ESL) of each capacitor element included in the capacitor array.

Note that there is room for improvement in terms of reducing the equivalent series resistance and the equivalent series inductance not only in the capacitor array including the plurality of capacitor elements but also in a single capacitor element.

An object of the present disclosure is to provide a capacitor element capable of reducing an equivalent series resistance and an equivalent series inductance. Another object of the present disclosure is to provide a module including the capacitor element. Still another object of the present disclosure is to provide a semiconductor composite device including the module.

A capacitor element according to the present disclosure includes: a capacitor portion including an anode plate having a porous portion on at least one main surface of a core portion, a dielectric layer on a surface of the porous portion, and a cathode layer on a surface of the dielectric layer; a first cathode through conductor penetrating the dielectric layer and the anode plate in a thickness direction and electrically connected to the cathode layer; a second cathode through conductor penetrating the dielectric layer and the anode plate in a thickness direction and electrically connected to the cathode layer; and an anode through conductor penetrating the dielectric layer and the anode plate in the thickness direction and electrically connected to the anode plate, wherein, in a plan view from a thickness direction of the anode plate, a first center-to-center distance between the first anode through conductor and the first cathode through conductor is equivalent to a second center-to-center distance between the first anode through conductor and the second cathode through conductor.

A module according to the present disclosure is a module configured to be used in a semiconductor composite device configured to supply a load with a DC voltage adjusted by a voltage regulator including a semiconductor active element, the module including the capacitor element according to the present disclosure, wherein the through conductor of the capacitor element is used for electrical connection between the capacitor element and at least one of the voltage regulator and the load.

A semiconductor composite device according to the present disclosure is a semiconductor composite device configured to convert an input DC voltage into a DC voltage different from the input DC voltage, the semiconductor composite device including a voltage regulator including a semiconductor active element, the module according to the present disclosure, and a load to which the converted DC voltage is supplied.

According to the present disclosure, a capacitor element capable of reducing an equivalent series resistance and an equivalent series inductance can be provided. Further, according to the present disclosure, a module including the capacitor element can be provided. Furthermore, according to the present disclosure, a semiconductor composite device including the module can be provided.

DESCRIPTION OF THE PREFERRED EMBODIMENTS

A capacitor element according to the present disclosure will be described below. Note that the present disclosure is not limited to the following configuration, and may be appropriately modified without departing from the scope of the present disclosure. Further, a combination of a plurality of individual preferred configurations, which will be described below, is also included in the present disclosure.

Each of the embodiments, which will be described below, is an example, and it is needless to say that partial replacement or combination of configurations described in different embodiments is possible. In second and subsequent embodiments, description of the same matters as those in the first embodiment will be omitted, and only different points will be described. In particular, similar operations and effects due to similar configurations will not be sequentially described for each embodiment.

In the following description, when the embodiments are not particularly distinguished from each other, a capacitor element according to each embodiment is simply referred to as a "capacitor element according to the present disclosure".

In the present specification, terms indicating a relationship between elements (for example, "perpendicular", "parallel", "orthogonal", and the like) and terms indicating shapes of elements are not expressions indicating only strict meanings, but are expressions indicating substantially equivalent ranges, for example, expressions also including a difference of about several %.

The drawings, which will be described below, are schematic views, and the dimensions, the scales of the aspect ratios, and the like may be different from those of an actual product.

First Embodiment

Figure 1:
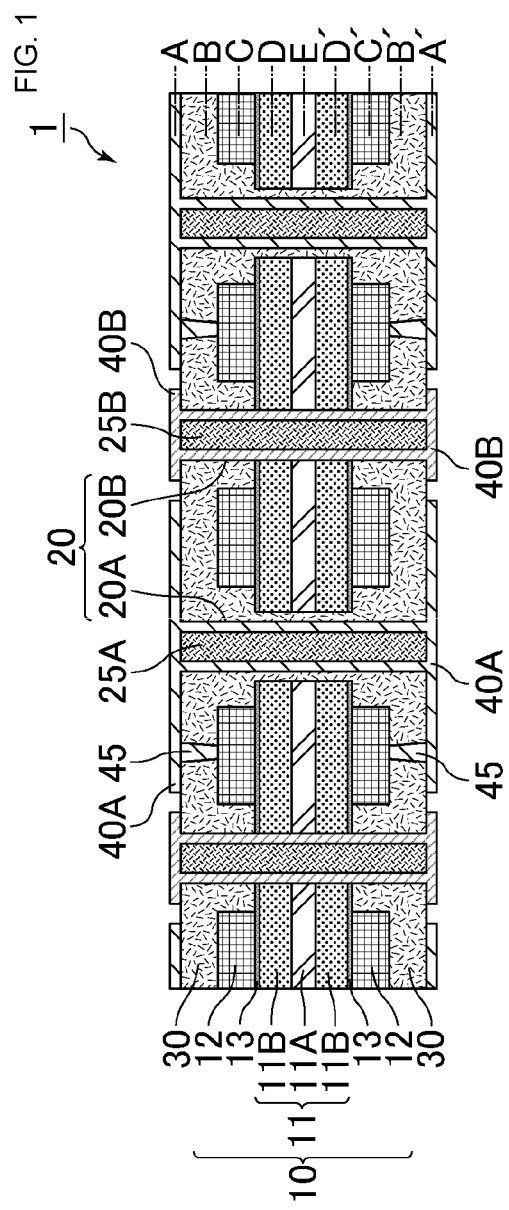
FIG. 1 is a cross-sectional view schematically illustrating an example of a capacitor element according to a first embodiment of the present disclosure.
Figure 2A:
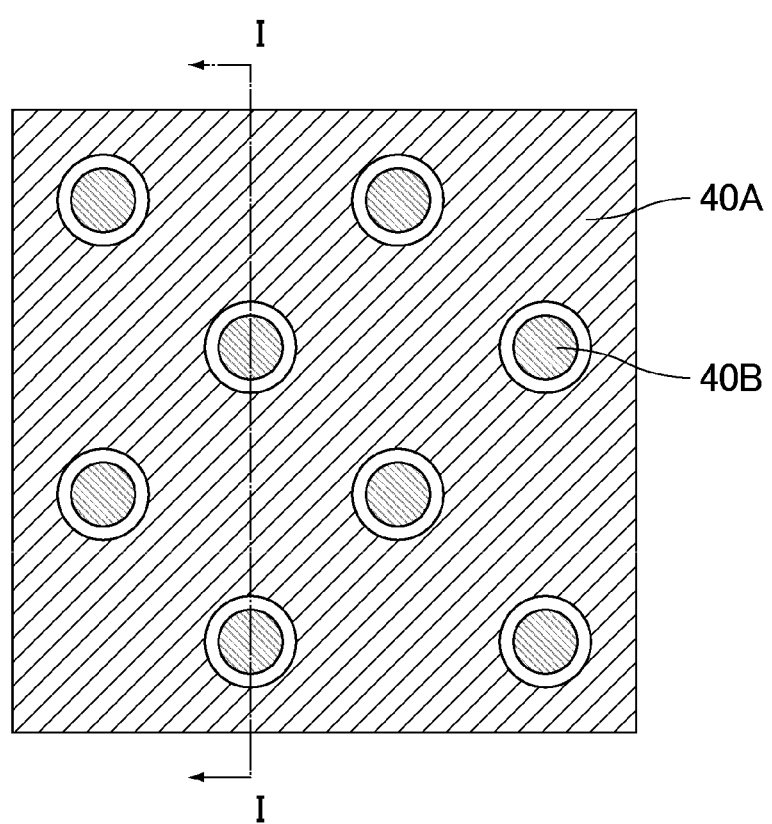
FIG. 2A is a plan view taken along a line A and a line A' of FIG. 1.
Figure 2B:
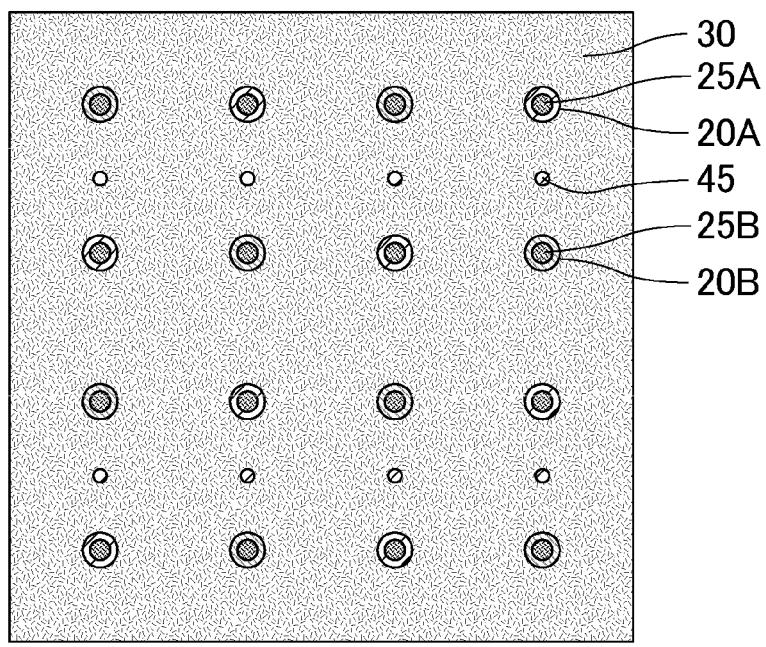
FIG. 2B is a plan view taken along a line B and a line B' of FIG. 1.
Figure 2C:
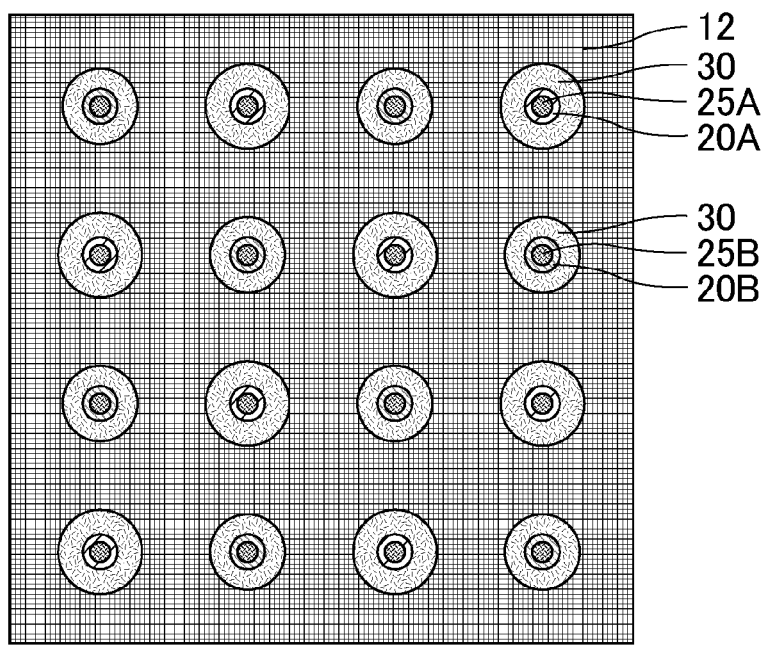
FIG. 2C is a plan view taken along a line C and a line C' of FIG. 1.
Figure 2D:
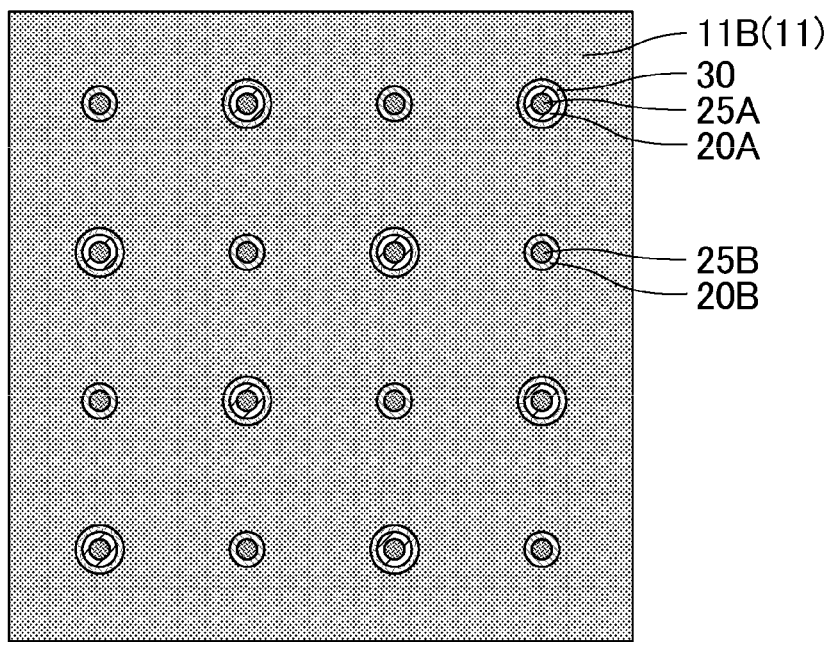
FIG. 2D is a plan view taken along a line D and a line D' of FIG. 1.
Figure 2E:
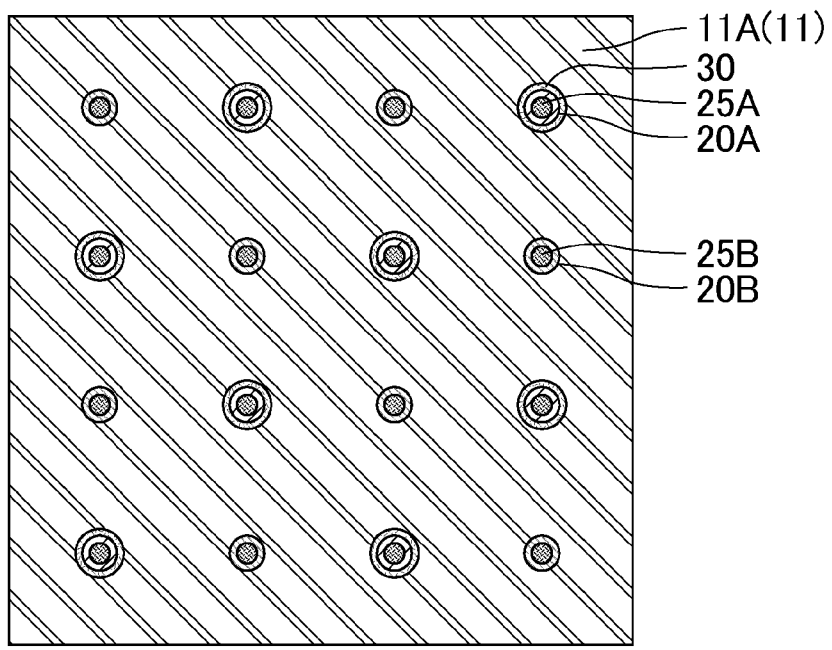
FIG. 2E is a plan view taken along a line E of FIG. 1.

FIG. 1 is a cross-sectional view schematically illustrating an example of a capacitor element according to a first embodiment of the present disclosure. FIG. 2A is a plan view taken along a line A and a line A' of FIG. 1. FIG. 2B is a plan view taken along a line B and a line B' of FIG. 1. FIG. 2C is a plan view taken along a line C and a line C' of FIG. 1. FIG. 2D is a plan view taken along a line D and a line D' of FIG. 1. FIG. 2E is a plan view taken along a line E of FIG. 1. FIG. 1 is a cross-sectional view taken along line I-I of FIG. 2A.

A capacitor element 1 illustrated in FIG. 1 includes a capacitor portion 10 and a through conductor 20. In the example illustrated in FIG. 1, the capacitor element 1 further includes a sealing layer 30 and conductive interconnect layers 40A and 40B.

The capacitor portion 10 includes an anode plate 11 including a porous portion 11B on at least one main surface of a core portion 11A, a dielectric layer 13 provided on a surface of the porous portion 11B, and a cathode layer 12 provided on a surface of the dielectric layer 13. Thus, the capacitor portion 10 constitutes an electrolytic capacitor. In the example illustrated in FIG. 1, the anode plate 11 includes the porous portions 11B on both main surfaces of the core portion 11A, but may have the porous portion 11B on only one of the main surfaces of the core portion 11A.

The cathode layer 12 includes, for example, a solid electrolyte layer provided on the surface of the dielectric layer 13. The cathode layer 12 preferably further includes a conductor layer provided on the surface of the solid electrolyte layer. When the cathode layer 12 includes the solid electrolyte layer, the capacitor portion 10 constitutes a solid electrolytic capacitor.

The through conductor 20 penetrates the dielectric layer 13 and the anode plate 11 in a thickness direction (a vertical direction in FIG. 1).

The through conductor 20 includes a cathode through conductor 20A electrically connected to the cathode layer 12 and an anode through conductor 20B electrically connected to the anode plate 11.

In the example illustrated in FIG. 1, a plurality of cathode through conductors 20A are provided so as to penetrate the sealing layer 30 and the capacitor portion 10 in the thickness direction. Each of the cathode through conductors 20A is connected at an end portion thereof to the conductive interconnect layer 40A provided on a surface of the sealing layer 30.

As illustrated in FIG. 2C, the cathode through conductors 20A are preferably present inside the cathode layer 12 in plan view in the thickness direction of the anode plate 11.

The cathode through conductors 20A may be provided at least on inner wall surfaces of through holes penetrating the sealing layer 30 and the capacitor portion 10 in the thickness direction. That is, the cathode through conductors 20A may be provided only on the inner wall surfaces of the through holes or may be entirely provided inside the through holes. When the cathode through conductors 20A are provided only on the inner wall surfaces of the through holes, spaces surrounded by the cathode through conductors 20A in the through holes may be filled with a material containing resin. That is, a resin-filled portion 25A may be provided inside the cathode through conductor 20A.

As illustrated in FIG. 1, an insulating material of the sealing layer 30 or the like is filled between the cathode through conductor 20A and the through hole that penetrates the sealing layer 30 and the capacitor portion 10 in the thickness direction.

In the example illustrated in FIG. 1, a plurality of anode through conductors 20B are provided so as to penetrate the sealing layer 30 and the capacitor portion 10 in the thickness direction. Each of the anode through conductors 20B is connected at an end portion thereof to the conductive interconnect layer 40B provided on the surface of the sealing layer 30.

As illustrated in FIG. 2C, the anode through conductors 20B are preferably present inside the cathode layer 12 in plan view in the thickness direction of the anode plate 11.

The anode through conductors 20B may be provided at least on the inner wall surfaces of the through holes penetrating the sealing layer 30 and the capacitor portion 10 in the thickness direction. That is, the anode through conductors 20B may be provided only on the inner wall surfaces of the through holes or may be entirely provided inside the through holes. When the anode through-conductors 20B are provided only on the inner wall surfaces of the through holes, spaces surrounded by the anode through conductors 20B in the through holes may be filled with a material containing resin. That is, a resin-filled portion 25B may be provided inside the anode through conductor 20B.

In the present specification, of the through conductor 20, a through conductor that penetrates the sealing layer 30 and the capacitor portion 10 in the thickness direction and that is connected to the conductive interconnect layer 40A or 40B at an end portion thereof is referred to as a "direct through conductor". Each of the cathode through conductor 20A and the anode through conductor 20B is the direct through conductor.

As illustrated in FIG. 1, the anode through conductors 20B are preferably electrically connected to the anode plate 11 on the inner wall surfaces of the through holes penetrating the sealing layer 30 and the capacitor portion 10 in the thickness direction. To be more specific, each of the anode through conductors 20B is preferably electrically connected to an end surface of the anode plate 11 facing the inner wall surface of the through hole in a planar direction. In this case, an insulating material such as the sealing layer 30 is not filled between the anode through conductor 20B and the through hole that penetrates the sealing layer 30 and the capacitor portion 10 in the thickness direction.

As illustrated in FIG. 1, the core portion 11A and the porous portion 11B are preferably exposed at the end surface of the anode plate 11 electrically connected to the anode through conductor 20B. In this case, the porous portion 11B is electrically connected to the anode through conductor 20B in addition to the core portion 11A.

As illustrated in FIG. 2D and FIG. 2E, the anode through conductor 20B is preferably electrically connected to the anode plate 11 over the entire circumference of the through hole penetrating the sealing layer 30 and the capacitor portion 10 when viewing from the thickness direction of the anode plate 11.

The anode through conductor 20B may be electrically connected to the anode plate 11 with an anode connection layer interposed therebetween, or may be directly connected to the end surface of the anode plate 11.

The sealing layer 30 is provided so as to cover the capacitor portion 10. By using the sealing layer 30, the capacitor portion 10 is protected by the sealing layer 30.

As illustrated in FIG. 1, the sealing layer 30 is preferably provided on each of both main surfaces of the capacitor portion 10 that are opposed to each other in the thickness direction.

The conductive interconnect layers 40A and 40B are provided on the surface of the sealing layer 30, and are electrically connected to either the cathode through conductor 20A or the anode through conductor 20B.

The conductive interconnect layer 40A is electrically connected to the cathode through conductor 20A. In the example illustrated in FIG. 1, the conductive interconnect layers 40A are provided on the surfaces of the cathode through conductor 20A and function as connection terminals of the capacitor element 1.

Specifically, in the example illustrated in FIG. 1, the conductive interconnect layers 40A are electrically connected to the cathode layers 12 through via conductors 45 penetrating the sealing layer 30, and function as connection terminals for the cathode layers 12.

The conductive interconnect layers 40B are electrically connected to the anode through conductor 20B. In the example illustrated in FIG. 1, the conductive interconnect layers 40B are provided on the surfaces of the anode through conductor 20B and function as connection terminals of the capacitor element 1.

To be more specific, in the example illustrated in FIG. 1, the conductive interconnect layers 40B are electrically connected to the anode plate 11 through the anode through conductor 20B, and function as connection terminals for the anode plate 11.

Figure 3:
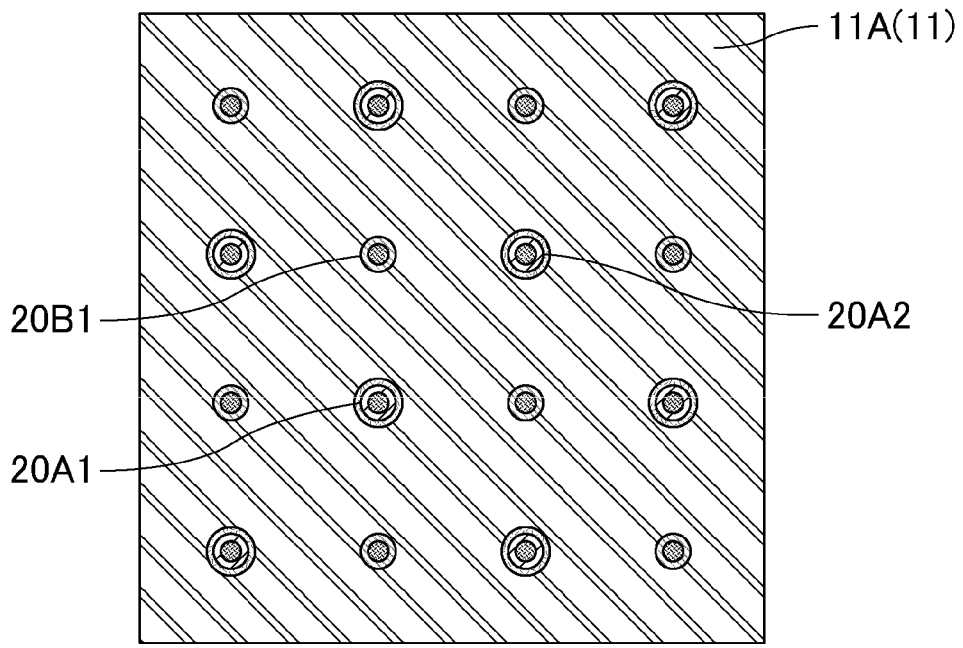
FIG. 3 is a plan view schematically illustrating an example of an arrangement of through conductors constituting the capacitor element according to the first embodiment of the present disclosure.

FIG. 3 is a plan view schematically illustrating an example of an arrangement of the through conductors constituting the capacitor element according to the first embodiment of the present disclosure. The plan view illustrated in FIG. 3 is identical to the plan view illustrated in FIG. 2E.

In the example illustrated in FIG. 3, the through conductors are arranged squarely. In the square arrangement, the through conductors are arranged at the respective vertices of the square. In FIG. 3, the cathode through conductors and the anode through conductors are alternately arranged from an upper side toward a lower side, and the cathode through conductors and the anode through conductors are alternately arranged from a left side toward a right side.

In FIG. 3, the cathode through conductors include a first cathode through conductor 20A1 and a second cathode through conductor 20A2, and the anode through conductors include a first anode through conductor 20B1. In plan view from the thickness direction of the anode plate 11, a center-to-center distance between the first anode through conductor 20B1 and the first cathode through conductor 20A1 is equivalent to a center-to-center distance between the first anode through conductor 20B1 and the second cathode through conductor 20A2.

In the capacitor element according to the first embodiment of the present disclosure, a plurality of cathode through conductors are electrically connected to one cathode layer, and thus current paths are formed in parallel for one capacitor element, which can reduce an equivalent series resistance and an equivalent series inductance. Further, the center-to-center distances between the anode through conductors and the cathode through conductors are made uniform, which can reduce an impedance difference between the respective current paths. Further, heat generated by the capacitor element can be dispersed, and a current capacitance can be increased.

In the present specification, the center of the through conductor means the center of the smallest circle including the through conductor in plan view from the thickness direction of the anode plate. Thus, the center-to-center distance between the anode through conductor and the cathode through conductor means a length of a line segment connecting the center of the anode through conductor and the center of the cathode through conductor that are obtained by the above-described method. A similar applies to a center-to-center distance between the cathode through conductors and a center-to-center distance between the anode through conductors.

Moreover, in the present specification, the expression "the center-to-center distances are equivalent to each other" means not only a case where the center-to-center distances are completely equivalent to each other, but also a case where the center-to-center distances are substantially equivalent to each other, for example, a case where a difference of about several % is included.

Note that each of the first cathode through conductor 20A1, the second cathode through conductor 20A2, and the first anode through conductor 20B1 is a direct through conductor that penetrates the sealing layer 30 and the capacitor portion 10 in the thickness direction and that is connected to the conductive interconnect layer 40A or 40B at the end portion thereof.

Figure 4:
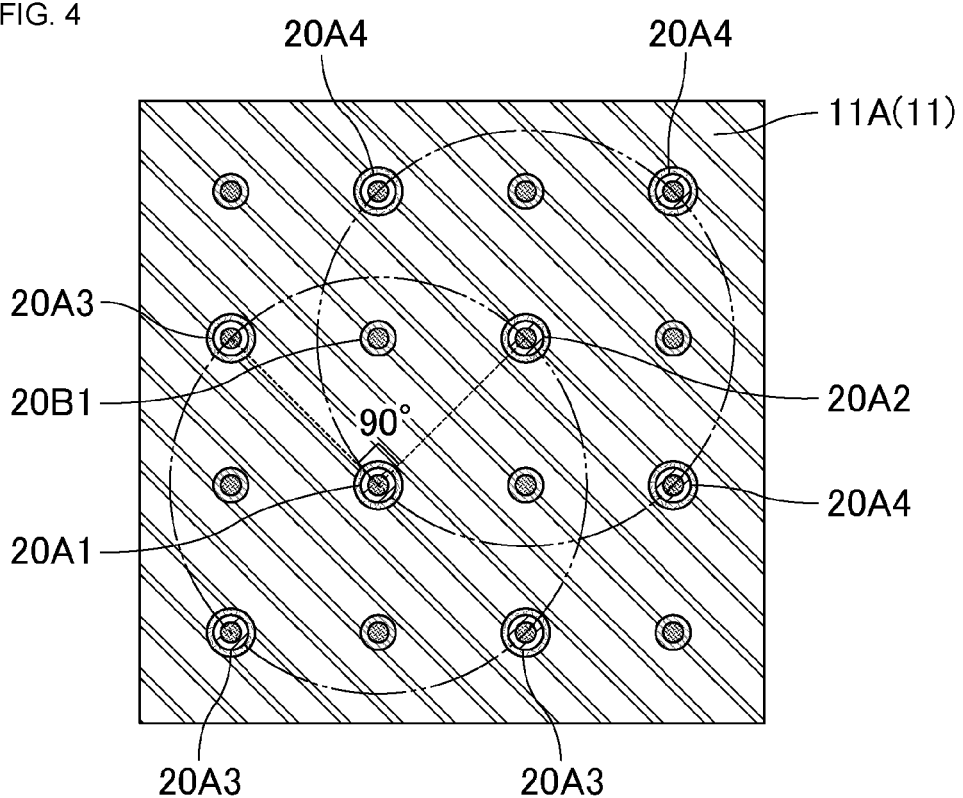
FIG. 4 is a plan view for describing an arrangement of cathode through conductors in the arrangement illustrated in FIG. 3.

FIG. 4 is a plan view for describing an arrangement of the cathode through conductors in the arrangement illustrated in FIG. 3.

As illustrated in FIG. 4, the cathode through conductors preferably further include at least a single third cathode through conductor 20A3. In plan view from the thickness direction of the anode plate 11, the center-to-center distance between the first cathode through conductor 20A1 and the second cathode through conductor 20A2 is equivalent to a center-to-center distance between the first cathode through conductor 20A1 and the third cathode through conductor 20A3. In the example illustrated in FIG. 4, three third cathode through conductors 20A3 are present.

When the cathode through conductors include the third cathode through conductor 20A3, as illustrated in FIG. 4, the third cathode through conductor 20A3 is preferably present on a straight line obtained by rotating a line segment connecting the center of the first cathode through conductor 20A1 and the center of the second cathode through conductor 20A2 by an angle of 90 degrees or 180 degrees with the center of the first cathode through conductor 20A1 serving as a reference, in plan view from the thickness direction of the anode plate 11. In this case, the smallest circle that includes the third cathode through conductor 20A3 in plan view from the thickness direction of the anode plate 11 may be present on the straight line obtained by rotating the line segment connecting the center of the first cathode through conductor 20A1 and the center of the second cathode through conductor 20A2 by the angle of 90 degrees or 180 degrees with the center of the first cathode through conductor 20A1 serving as the reference.

Note that the third cathode through conductor 20A3 is a direct through conductor that penetrates the sealing layer 30 and the capacitor portion 10 in the thickness direction and that is connected to the conductive interconnect layer 40A at an end portion thereof.

Further, as illustrated in FIG. 4, the cathode through conductors preferably further include at least a single fourth cathode through conductor 20A4. In plan view from the thickness direction of the anode plate 11, the center-to-center distance between the second cathode through conductor 20A2 and the first cathode through conductor 20A1 is equivalent to a center-to-center distance between the second cathode through conductor 20A2 and a fourth cathode through conductor 20A4. In the example illustrated in FIG. 4, three fourth cathode through conductors 20A4 are present.

When the cathode through conductors include the fourth cathode through conductor 20A4, the fourth cathode through conductor 20A4 is preferably present on a straight line obtained by rotating the line segment connecting the center of the first cathode through conductor 20A1 and the center of the second cathode through conductor 20A2 by an angle of 90 degrees or 180 degrees with the center of the second cathode through conductor 20A2 serving as a reference, in plan view from the thickness direction of the anode plate 11. In this case, the smallest circle that includes the fourth cathode through conductor 20A4 in plan view from the thickness direction of the anode plate 11 may exist on the straight line obtained by rotating the line segment connecting the center of the first cathode through conductor 20A1 and the center of the second cathode through conductor 20A2 by the angle of 90 degrees or 180 degrees with the center of the second cathode through conductor 20A2 serving as the reference.

Note that the fourth cathode through conductor 20A4 is a direct through conductor that penetrates the sealing layer 30 and the capacitor portion 10 in the thickness direction and that is connected to the conductive interconnect layer 40A at the end portion thereof.

Figure 5:
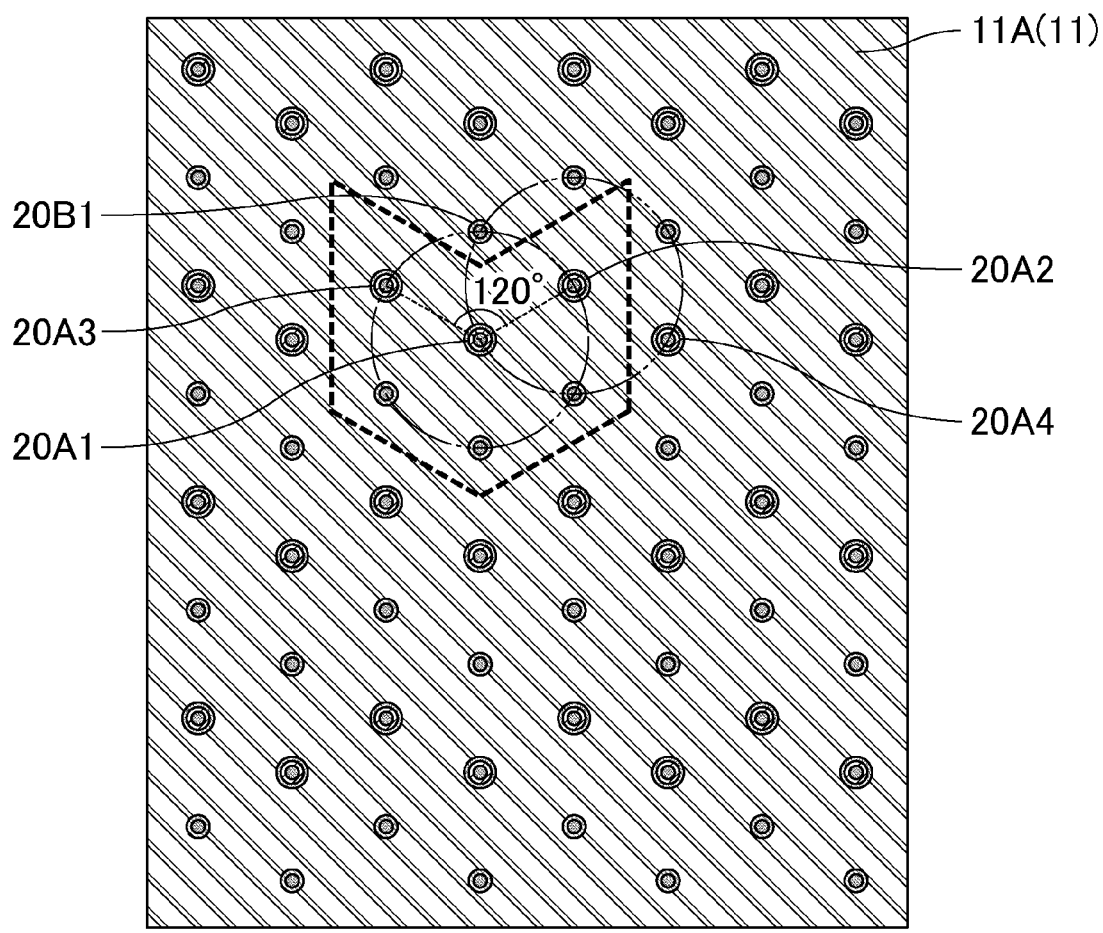
FIG. 5 is a plan view schematically illustrating another example of the arrangement of the through conductors constituting the capacitor element according to the first embodiment of the present disclosure.

FIG. 5 is a plan view schematically illustrating another example of the arrangement of the through conductors constituting the capacitor element according to the first embodiment of the present disclosure.

In the example illustrated in FIG. 5, the through conductors are arranged hexagonally. In the hexagonal arrangement, the through conductors are arranged at the respective vertices of a regular hexagon and the center of the regular hexagon. In FIG. 5, the cathode through conductors and the anode through conductors are alternately arranged from the upper side toward the lower side.

In FIG. 5, the cathode through conductors include the first cathode through conductor 20A1 and the second cathode through conductor 20A2, and the anode through conductors include the first anode through conductor 20B1. In plan view from the thickness direction of the anode plate 11, a center-to-center distance between the first anode through conductor 20B1 and the first cathode through conductor 20A1 is equivalent to a center-to-center distance between the first anode through conductor 20B1 and the second cathode through conductor 20A2.

In the example illustrated in FIG. 5, a single third cathode through conductor 20A3 is present.

When the cathode through conductors include the third cathode through conductor 20A3, as illustrated in FIG. 5, the third cathode through conductor 20A3 is preferably present on a straight line obtained by rotating a line segment connecting the center of the first cathode through conductor 20A1 and the center of the second cathode through conductor 20A2 by an angle of 60 degrees or 120 degrees with the center of the first cathode through conductor 20A1 serving as a reference, in plan view from the thickness direction of the anode plate 11. In this case, the smallest circle that includes the third cathode through conductor 20A3 in plan view from the thickness direction of the anode plate 11 may be present on the straight line obtained by rotating the line segment connecting the center of the first cathode through conductor 20A1 and the center of the second cathode through conductor 20A2 by the angle of 60 degrees or 120 degrees with the center of the first cathode through conductor 20A1 serving as the reference.

Further, in the example illustrated in FIG. 5, a single fourth cathode through conductor 20A4 is present.

When the cathode through conductors include the fourth cathode through conductor 20A4, the fourth cathode through conductor 20A4 is preferably present on a straight line obtained by rotating the line segment connecting the center of the first cathode through conductor 20A1 and the center of the second cathode through conductor 20A2 by an angle of 60 degrees or 120 degrees with the center of the second cathode through conductor 20A2 serving as a reference, in plan view from the thickness direction of the anode plate 11. In this case, the smallest circle that includes the fourth cathode through conductor 20A4 in plan view from the thickness direction of the anode plate 11 may exist on the straight line obtained by rotating the line segment connecting the center of the first cathode through conductor 20A1 and the center of the second cathode through conductor 20A2 by the angle of 60 degrees or 120 degrees with the center of the second cathode through conductor 20A2 serving as the reference.

As illustrated in FIG. 4 or FIG. 5, when the cathode through conductors include the third cathode through conductor 20A3, the third cathode through conductor 20A3 is preferably present on a straight line obtained by rotating the line segment connecting the center of the first cathode through conductor 20A1 and the center of the second cathode through conductor 20A2 by an angle of 60 degrees, 90 degrees, 120 degrees, or 180 degrees with the center of the first cathode through conductor 20A1 serving as a reference, in plan view from the thickness direction of the anode plate 11.

In addition, when the cathode through conductors include the fourth cathode through conductor 20A4, the fourth cathode through conductor 20A4 is preferably present on a straight line obtained by rotating the line segment connecting the center of the first cathode through conductor 20A1 and the center of the second cathode through conductor 20A2 by an angle of 60 degrees, 90 degrees, 120 degrees, or 180 degrees with the center of the second cathode through conductor 20A2 serving as a reference, in plan view from the thickness direction of the anode plate 11.

Figure 6:
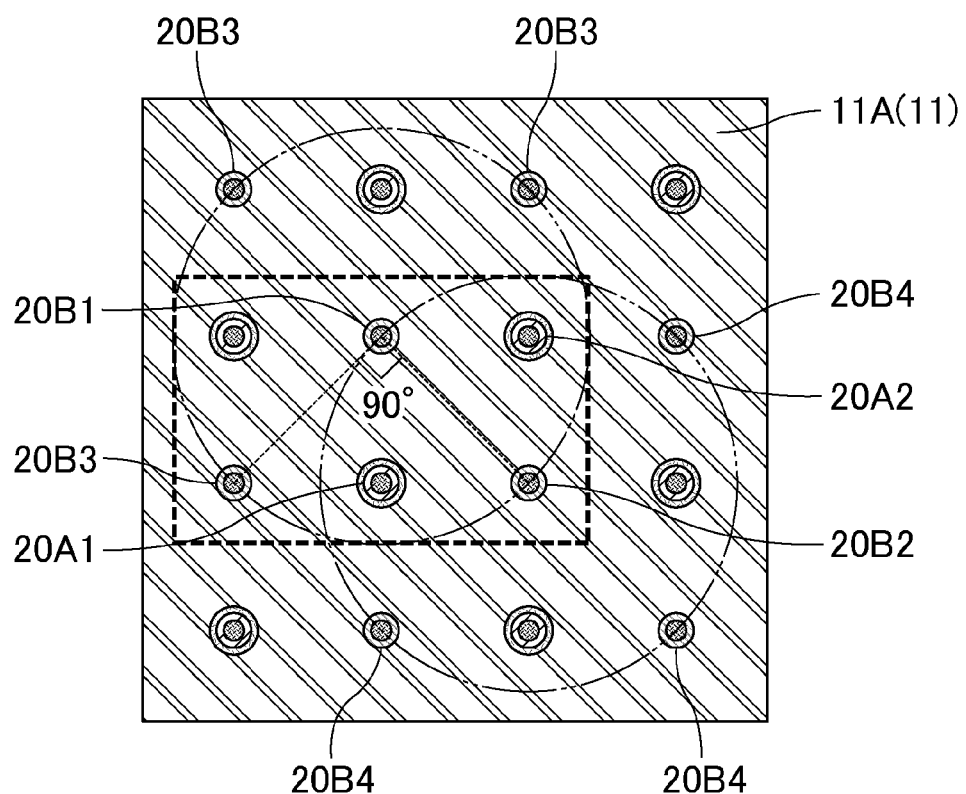
FIG. 6 is a plan view for describing the arrangement of anode through conductors in the arrangement illustrated in FIG. 3.

FIG. 6 is a plan view for describing the arrangement of the anode through conductors in the arrangement illustrated in FIG. 3.

As illustrated in FIG. 6, the anode through conductors may further include a second anode through conductor 20B2. In plan view from the thickness direction of the anode plate 11, a center-to-center distance between the first cathode through conductor 20A1 and the first anode through conductor 20B1 is equivalent to a center-to-center distance between the first cathode through conductor 20A1 and the second anode through conductor 20B2.

Note that the second anode through conductor 20B2 is a direct through conductor that penetrates the sealing layer 30 and the capacitor portion 10 in the thickness direction and that is connected to the conductive interconnect layer 40B at the end portion thereof.

As illustrated in FIG. 6, the anode through conductors may further include at least a single third anode through conductor 20B3. In plan view from the thickness direction of the anode plate 11, a center-to-center distance between the first anode through conductor 20B1 and the second anode through conductor 20B2 is equivalent to a center-to-center distance between the first anode through conductor 20B1 and the third anode through conductor 20B3. In the example illustrated in FIG. 6, three third anode through conductors 20B3 are present.

When the anode through conductors include the third anode through conductor 20B3, as illustrated in FIG. 6, the third anode through conductor 20B3 is preferably present on a straight line obtained by rotating a line segment connecting the center of the first anode through conductor 20B1 and the center of the second anode through conductor 20B2 by an angle of 90 degrees or 180 degrees with the center of the first anode through conductor 20B1 serving as a reference, in plan view from the thickness direction of the anode plate 11. In this case, the smallest circle that includes the third anode through conductor 20B3 in plan view from the thickness direction of the anode plate 11 may be present on a straight line obtained by rotating the line segment connecting the center of the first anode through conductor 20B1 and the center of the second anode through conductor 20B2 by the angle of 90 degrees or 180 degrees with the center of the first anode through conductor 20B1 serving as the reference.

Note that the third anode through conductor 20B3 is a direct through conductor that penetrates the sealing layer 30 and the capacitor portion 10 in the thickness direction and that is connected to the conductive interconnect layer 40B at the end portion thereof.

Further, as illustrated in FIG. 6, the anode through conductors preferably further include at least a single fourth anode through conductor 20B4. In plan view from the thickness direction of the anode plate 11, the center-to-center distance between the second anode through conductor 20B2 and the first anode through conductor 20B1 is equivalent to a center-to-center distance between the second anode through conductor 20B2 and the fourth anode through conductor 20B4. In the example illustrated in FIG. 6, three fourth anode through conductors 20B4 are present.

When the anode through conductors include the fourth anode through conductor 20B4, the fourth anode through conductor 20B4 is preferably present on a straight line obtained by rotating the line segment connecting the center of the first anode through conductor 20B1 and the center of the second anode through conductor 20B2 by an angle of 90 degrees or 180 degrees with the center of the second anode through conductor 20B2 serving as a reference, in plan view from the thickness direction of the anode plate 11. In this case, the smallest circle that includes the fourth anode through conductor 20B4 in plan view from the thickness direction of the anode plate 11 may exist on the straight line obtained by rotating the line segment connecting the center of the first anode through conductor 20B1 and the center of the second anode through conductor 20B2 by the angle of 90 degrees or 180 degrees with the center of the second anode through conductor 20B2 serving as the reference.

Note that the fourth anode through conductor 20B4 is a direct through conductor that penetrates the sealing layer 30 and the capacitor portion 10 in the thickness direction and that is connected to the conductive interconnect layer 40B at the end portion thereof.

Figure 7:
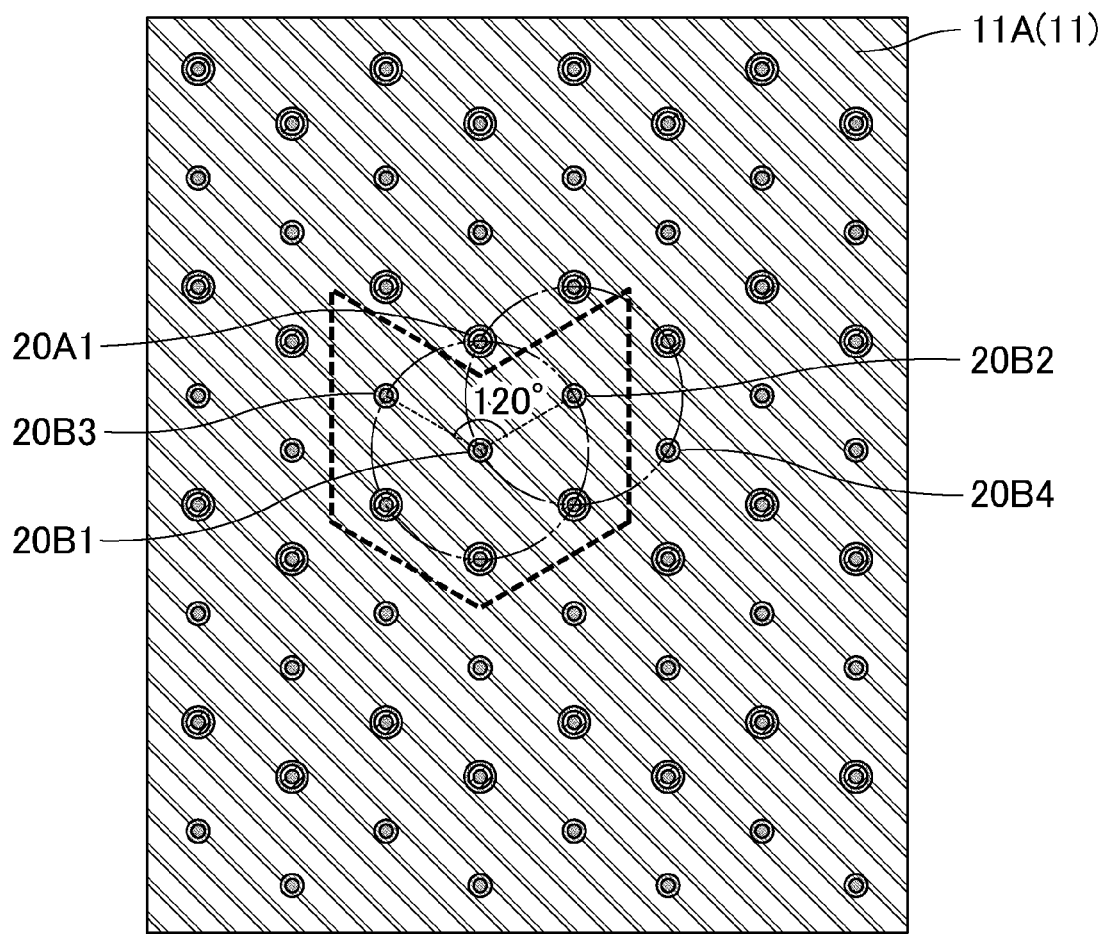
FIG. 7 is a plan view for describing the arrangement of the anode through conductors in the arrangement illustrated in FIG. 5.

FIG. 7 is a plan view for describing the arrangement of the anode through conductors in the arrangement illustrated in FIG. 5.

In FIG. 7 as well, the anode through conductor preferably further includes the second anode through conductor 20B2.

In the example illustrated in FIG. 7, a single third anode through conductor 20B3 exists.

When the anode through conductors include the third anode through conductor 20B3, as illustrated in FIG. 7, the third anode through conductor 20B3 is preferably present on a straight line obtained by rotating a line segment connecting the center of the first anode through conductor 20B1 and the center of the second anode through conductor 20B2 by an angle of 60 degrees or 120 degrees with the center of the first anode through conductor 20B1 serving as a reference, in plan view from the thickness direction of the anode plate 11. In this case, the smallest circle that includes the third anode through conductor 20B3 in plan view from the thickness direction of the anode plate 11 may be present on the straight line obtained by rotating the line segment connecting the center of the first anode through conductor 20B1 and the center of the second anode through conductor 20B2 by the angle of 60 degrees or 120 degrees with the center of the first anode through conductor 20B1 serving as the reference.

Further, in the example illustrated in FIG. 7, a single fourth anode through conductor 20B4 is present.

When the anode through conductors include the fourth anode through conductor 20B4, the fourth anode through conductor 20B4 is preferably present on a straight line obtained by rotating the line segment connecting the center of the first anode through conductor 20B1 and the center of the second anode through conductor 20B2 by an angle of 60 degrees or 120 degrees with the center of the second anode through conductor 20B2 serving as a reference, in plan view from the thickness direction of the anode plate 11. In this case, the smallest circle that includes the fourth anode through conductor 20B4 in plan view from the thickness direction of the anode plate 11 may exist on the straight line obtained by rotating the line segment connecting the center of the first anode through conductor 20B1 and the center of the second anode through conductor 20B2 by the angle of 60 degrees or 120 degrees with the center of the second anode through conductor 20B2 serving as the reference.

As illustrated in FIG. 6 or FIG. 7, when the anode through conductors include the third anode through conductor 20B3, the third anode through conductor 20B3 is preferably present on a straight line obtained by rotating the line segment connecting the center of the first anode through conductor 20B1 and the center of the second anode through conductor 20B2 by an angle of 60 degrees, 90 degrees, 120 degrees, or 180 degrees with the center of the first anode through conductor 20B1 serving as the reference, in plan view from the thickness direction of the anode plate 11.

In addition, when the anode through conductors include the fourth anode through conductor 20B4, the fourth anode through conductor 20B4 is preferably present on a straight line obtained by rotating the line segment connecting the center of the first anode through conductor 20B1 and the center of the second anode through conductor 20B2 by an angle of 60 degrees, 90 degrees, 120 degrees, or 180 degrees with the center of the second anode through conductor 20B2 serving as the reference, in plan view from the thickness direction of the anode plate 11.

Figure 8:
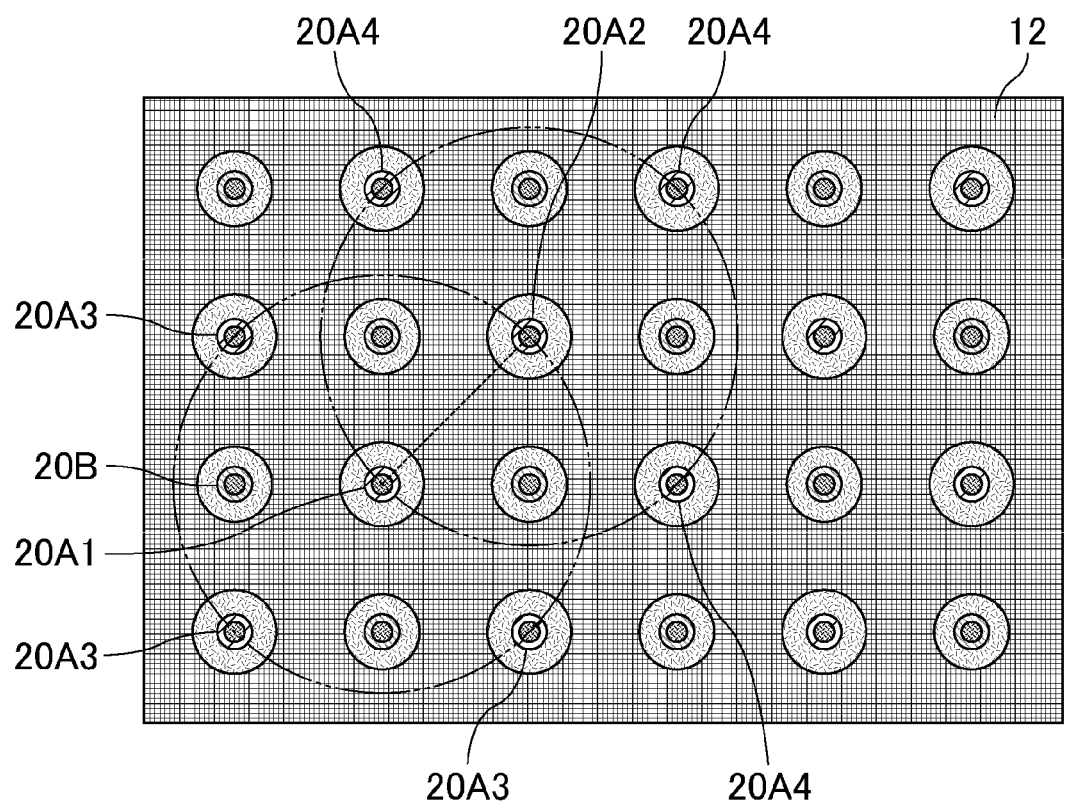
FIG. 8 is a plan view for describing the anode through conductors existing inside a circle having the center equal to the center of the cathode through conductor in the arrangement illustrated in FIG. 4.

FIG. 8 is a plan view for describing the anode through conductors existing inside a circle having the center equal to the center of the cathode through conductor in the arrangement illustrated in FIG. 4.

As illustrated in FIG. 8, it is preferable that, in plan view from the thickness direction from the anode plate, the number of the anode through conductors 20B existing inside a circle that has a radius equal to the center-to-center distance between the first cathode through conductor 20A1 and the second cathode through conductor 20A2 and that has the center equal to the center of the first cathode through conductor 20A1 be equal to the number of the anode through conductors 20B existing inside a circle that has a radius equal to the center-to-center distance between the first cathode through conductor 20A1 and the second cathode through conductor 20A2 and that has the center equal to the center of the second cathode through conductor 20A2. In the example illustrated in FIG. 8, four anode through conductors 20B are present inside each circle.

As illustrated in FIG. 8, arranging capacitors in a uniform and parallel manner on the uniformly arranged current paths can enhance noise removal effect.

In particular, it is preferable that in plan view from the thickness direction of the anode plate, a difference between a total area of the anode through conductors 20B overlapping the circle that has the radius equal to the center-to-center distance between the first cathode through conductor 20A1 and the second cathode through conductor 20A2 and that has the center equal to the center of the first cathode through conductor 20A1 and a total area of the anode through conductors 20B existing inside the circle that has the radius equal to the center-to-center distance between the first cathode through conductor 20A1 and the second cathode through conductor 20A2 and that has the center equal to the center of the second cathode through conductor 20A2 be within ±5%.

Figure 9:
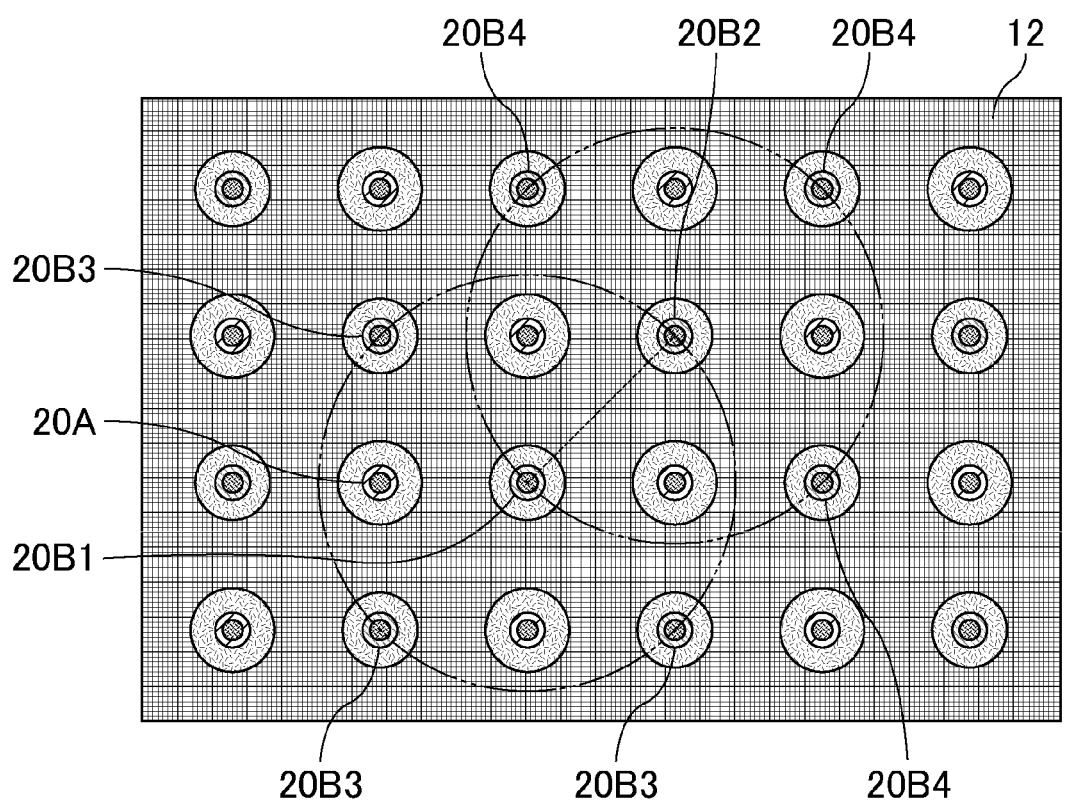
FIG. 9 is a plan view for describing the cathode through conductors existing inside a circle having the center equal to the center of the anode through conductor in the arrangement illustrated in FIG. 6.

FIG. 9 is a plan view for describing the cathode through conductors existing inside the circle having the center equal to the center of the anode through conductor in the arrangement illustrated in FIG. 6.

As illustrated in FIG. 9, it is preferable that in plan view from the thickness direction of the anode plate, the number of the cathode through conductors 20A existing inside a circle that has a radius equal to the center-to-center distance between the first anode through conductor 20B1 and the second anode through conductor 20B2 and that has the center equal to the center of the first anode through conductor 20B1 be equal to the number of the cathode through conductors 20A existing inside a circle that has a radius equal to the center-to-center distance between the first anode through conductor 20B1 and the second anode through conductor 20B2 and that has the center equal to the center of the second anode through conductor 20B2. In the example illustrated in FIG. 9, four cathode through conductors 20A are present inside each circle.

In particular, it is preferable that in plan view from the thickness direction of the anode plate, a difference between a total area of the cathode through conductors 20A overlapping the circle that has the radius equal to the center-to-center distance between the first anode through conductor 20B1 and the second anode through conductor 20B2 and that has the center equal to the center of the first anode through conductor 20B1 and a total area of the cathode through conductors 20A existing inside the circle that has the radius equal to the center-to-center distance between the first anode through conductor 20B1 and the second anode through conductor 20B2 and that has the center equal to the center of the second anode through conductor 20B2 be within ±5%.

Figure 10:
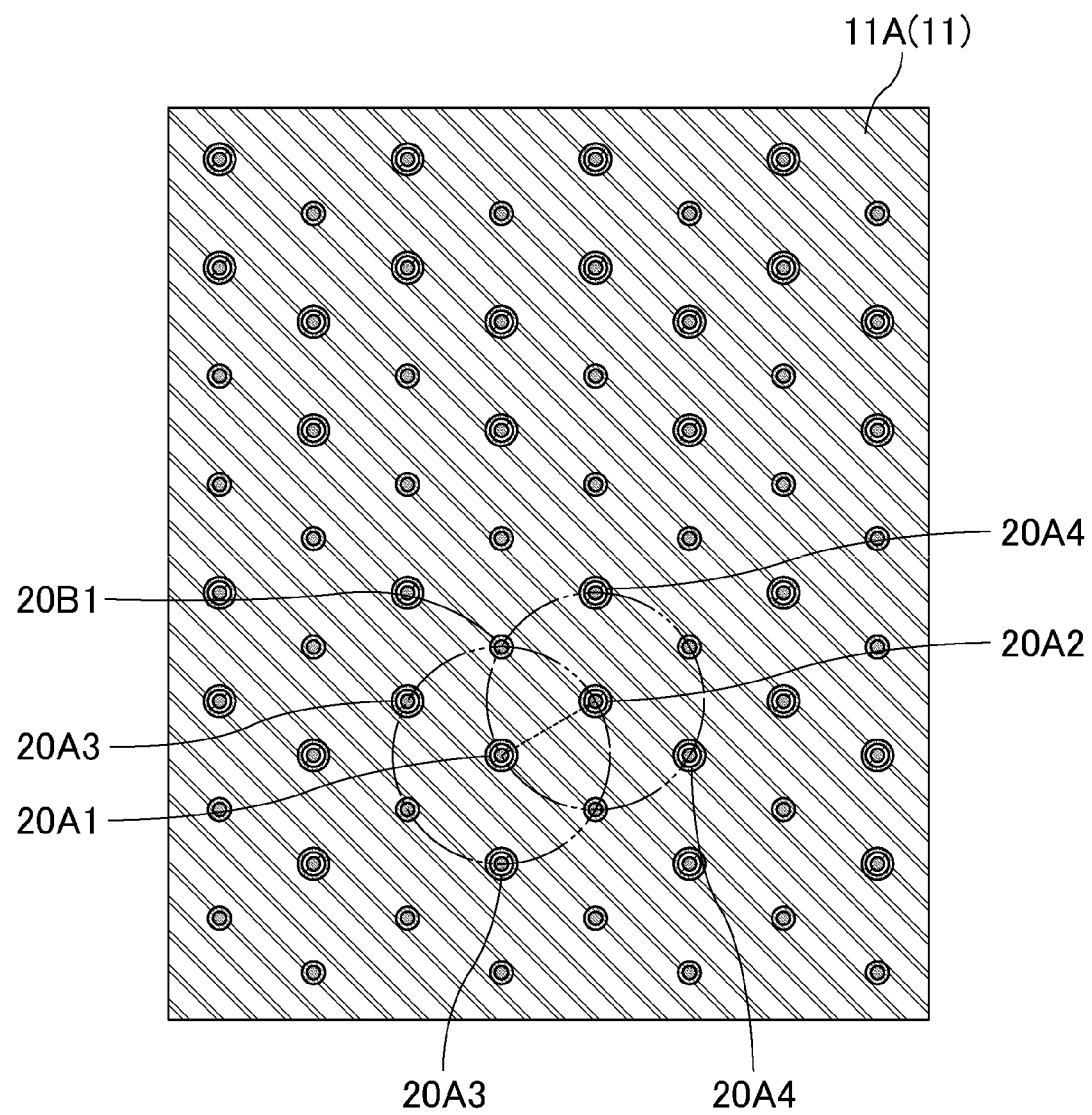
FIG. 10 is a plan view schematically illustrating still another example of the arrangement of the through conductors constituting the capacitor element according to the first embodiment of the present disclosure.

FIG. 10 is a plan view schematically illustrating still another example of the arrangement of the through conductors constituting the capacitor element according to the first embodiment of the present disclosure.

In the example illustrated in FIG. 10, the through conductors are arranged hexagonally. In FIG. 10, two cathode through conductors and two anode through conductors are alternately arranged from the upper side to the lower side.

In the example illustrated in FIG. 10, unlike the example illustrated in FIG. 5, two third cathode through conductors 20A3 and two fourth cathode through conductors 20A4 are present.

As illustrated in FIG. 4 or FIG. 10, when the cathode through conductors include the third cathode through conductors 20A3 and the fourth cathode through conductors 20A4, it is preferable that two or more third cathode through conductors 20A3 and two or more fourth cathode through conductors 20A4 be present. In this case, the effect of reducing the equivalent series resistance and the equivalent series inductance and the effect of reducing the impedance difference between the respective current paths can be enhanced. Further, the heat generated by the capacitor element can be dispersed, and the effect of increasing the current capacitance can be enhanced.

Figure 11:
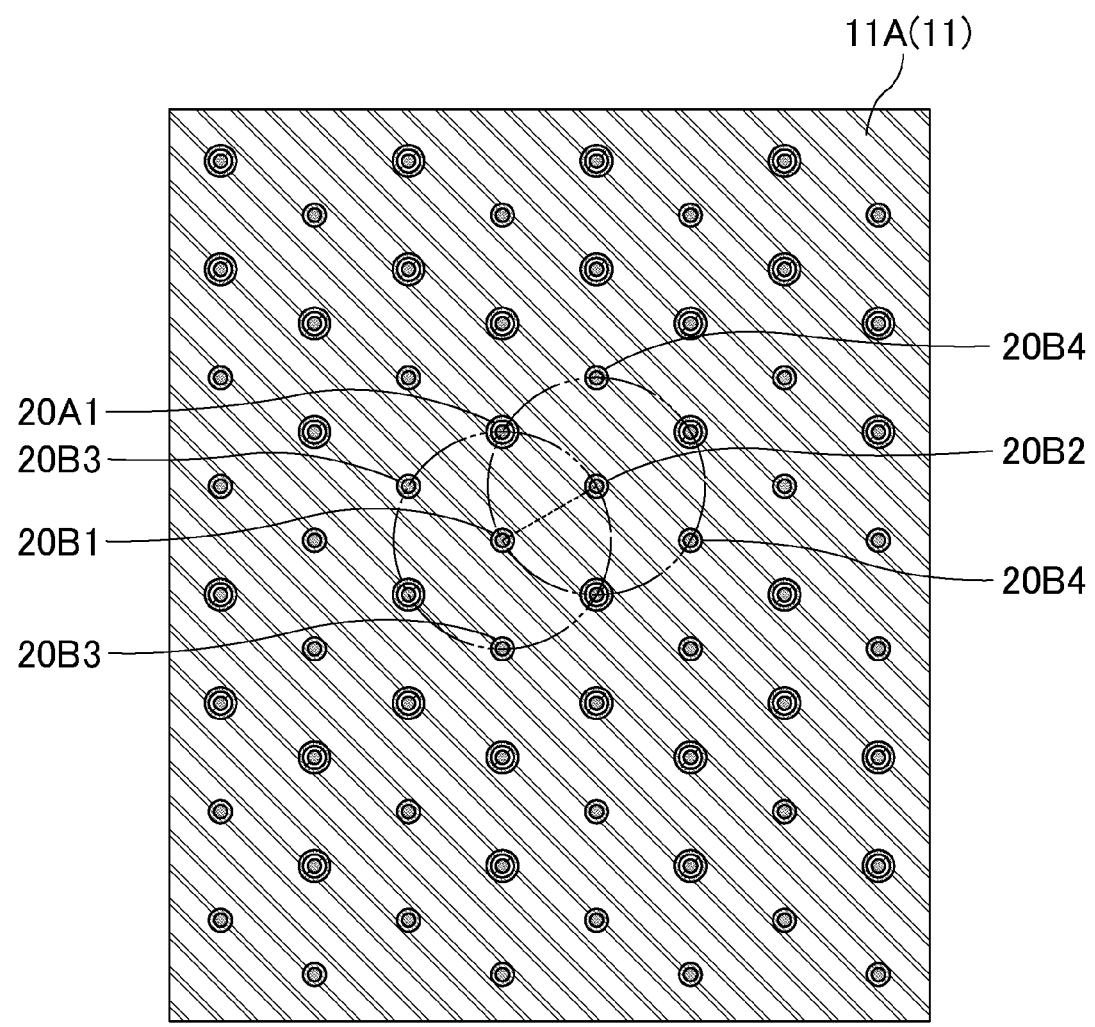
FIG. 11 is a plan view for describing the arrangement of the anode through conductors in the arrangement illustrated in FIG. 10.

FIG. 11 is a plan view for describing the arrangement of the anode through conductors in the arrangement illustrated in FIG. 10.

In the example illustrated in FIG. 11, unlike the example illustrated in FIG. 7, two third anode through conductors 20B3 and two fourth anode through conductors 20B4 are present.

As illustrated in FIG. 6 or FIG. 11, when the anode through conductors include the third anode through conductor 20B3 and the fourth anode through conductor 20B4, it is preferable that two or more third anode through conductors 20B3 and two or more fourth anode through conductors 20B4 be present.

The detailed configuration of the capacitor element 1 will be described below.

Examples of a planar shape of the capacitor element 1 when the capacitor element 1 is viewed from the thickness direction include a rectangle (a square or an oblong), a quadrangle other than the rectangle, a polygon such as a triangle, a pentagon, or a hexagon, a circle, an ellipse, and a shape obtained by combining these shapes. Additionally, the planar shape of the capacitor element 1 may be an L-shape, a C-shape (a U-shape), a stair-like shape, or the like.

The anode plate 11 is preferably made of a valving metal that exhibits a so-called valve action. Examples of the valving metal include a single metal element such as aluminum, tantalum, niobium, titanium, or zirconium, or an alloy containing at least one of these metals. Among these, aluminum or an aluminum alloy is preferable.

A shape of the anode plate 11 is preferably a flat plate shape, and is more preferably a foil shape. Thus, in the present specification, the "plate shape" includes the "foil shape".

The anode plate 11 may include the porous portion 11B on at least one main surface of the core portion 11A. That is, the anode plate 11 may include the porous portion 11B only on one main surface of the core portion 11A, or may include the porous portions 11B on both main surfaces of the core portion 11A. The porous portion 11B is preferably a porous layer formed on the surface of the core portion 11A, and is more preferably an etching layer.

A thickness of the anode plate 11 before an etching treatment is preferably equal to or more than 60 μm and equal to or less than 200 μm. A thickness of the core portion 11A that has not been etched after the etching treatment is preferably equal to or more than 15 μm and equal to or less than 70 μm. A thickness of the porous portion 11B is designed according to the required withstand voltage and electrostatic capacity, but a total of the thicknesses of the porous portions 11B on both sides of the core portion 11A is preferably equal to or more than 10 μm and equal to or less than 180 μm.

A pore diameter of the porous portion 11B is preferably equal to or more than 10 nm and equal to or less than 600 nm. Note that the pore diameter of the porous portion 11B means a median diameter D50 measured by a mercury porosimeter. The pore diameter of the porous portion 11B can be controlled by adjusting various conditions in the etching, for example.

The dielectric layer 13 provided on the surface of the porous portion 11B is made to be porous by reflecting the surface condition of the porous portion 11B, and has a fine uneven surface shape. The dielectric layer 13 is preferably made of an oxide film of the valving metal. For example, when aluminum foil is used as the anode plate 11, the dielectric layer 13 made of an oxide film can be formed by performing an anodizing oxidation treatment (also referred to as a chemical conversion treatment) on the surface of the aluminum foil in an aqueous solution containing ammonium adipate or the like.

A thickness of the dielectric layer 13 is designed according to the required withstand voltage and electrostatic capacity, and is preferably equal to or more than 10 nm and equal to or less than 100 nm.

When the cathode layer 12 includes a solid electrolyte layer, examples of the material constituting the solid electrolyte layer include electroconductive polymers such as polypyrroles, polythiophenes, and polyanilines. Among these, polythiophenes are preferable, and poly(3, 4-ethylenedioxythiophene) called PEDOT is particularly preferable. Additionally, the electroconductive polymer may contain a dopant such as polystyrene sulfonic acid (PSS). Note that the solid electrolyte layer preferably includes an inner layer filling thin pores (recesses) of the dielectric layer 13 and an outer layer covering the dielectric layer 13.

The solid electrolyte layer has a thickness preferably equal to or more than 2 μm and equal to or less than 20 μm from the surface of the porous portion 11B.

The solid electrolyte layer is formed by, for example, a method of forming a polymerized film such as poly(3, 4-ethylenedioxythiophene) on the surface of the dielectric layer 13 by using a treatment liquid containing a monomer such as 3, 4-ethylenedioxythiophene, or a method of applying a dispersion liquid of a polymer such as poly(3, 4-ethylenedioxythiophene) to the surface of the dielectric layer 13 and drying the dispersion liquid.

The solid electrolyte layer can be formed in a predetermined region by applying the treatment liquid or the dispersion liquid to the surface of the dielectric layer 13 by a method such as sponge transfer, screen printing, dispenser coating, or ink-jet printing.

When the cathode layer 12 includes a conductor layer, the conductor layer includes at least one of a conductive resin layer and a metal layer. The conductor layer may be only a conductive resin layer or only a metal layer. The conductor layer preferably covers the entire surface of the solid electrolyte layer.

Examples of the conductive resin layer include a conductive adhesive layer containing at least one type of conductive filler selected from the group consisting of a silver filler, a copper filler, a nickel filler, and a carbon filler.

Examples of the metal layer include a metal plating film and metal foil. The metal layer is preferably made of at least one metal selected from the group consisting of nickel, copper, silver, and alloys containing these metals as a main component. Note that the "main component" refers to an element component having the largest weight ratio.

The conductor layer includes, for example, a carbon layer provided on the surface of the solid electrolyte layer and a copper layer provided on the surface of the carbon layer.

The carbon layer is provided in order to electrically and mechanically connect the solid electrolyte layer and the copper layer. The carbon layer can be formed in a predetermined region by applying a carbon paste to the surface of the solid electrolyte layer by a method such as sponge transfer, screen printing, dispenser coating, or ink-jet printing. Note that it is preferable that the carbon layer be laminated with a copper layer in the next step in a viscous state before drying. A thickness of the carbon layer is preferably equal to or more than 2 μm and equal to or less than 20 μm.

The copper layer can be formed in a predetermined region by applying a copper paste to the surface of the carbon layer by a method such as sponge transfer, screen printing, spray coating, dispenser coating, or ink-jet printing. A thickness of the copper layer is preferably equal to or more than 2 μm and equal to or less than 20 μm.

The cathode through conductor 20A, which is a direct through conductor, of the through conductor 20 is formed, for example, as follows. First, a first through hole penetrating the capacitor portion 10 in the thickness direction is formed by drilling, laser processing, or the like. Next, the first through hole is filled with an insulating material such as the sealing layer 30. The portion filled with the insulating material is subjected to processing such as drilling or laser processing to form a second through hole. At this time, a diameter of the second through hole is made smaller than a diameter of the first through hole filled with the insulating material, so that the insulating material is present between an inner wall surface of the first through hole and an inner wall surface of the second through hole in the planar direction. Then, the inner wall surface of the second through hole is metallized by using a metal material containing a metal with a low resistance such as copper, gold, or silver to form the cathode through conductor 20A, which is a direct through conductor. When the cathode through conductor 20A is formed, for example, the inner wall surface of the second through hole is metallized by electroless copper plating, electrolyte copper plating, or the like, which facilitates the processing. Note that the cathode through conductor 20A may be formed by filling the second through hole with a metal material, a metal-resin composite material, or the like, instead of metallizing the inner wall surface of the second through hole.

The anode through conductor 20B, which is a direct through conductor, of the through conductor 20 is formed, for example, as follows. First, a third through hole is formed to penetrate the sealing layer 30 and the capacitor portion 10 in the thickness direction by drilling, laser processing, or the like. Then, an inner wall surface of the third through hole is metallized by using a metal material containing a metal with a low resistance such as copper, gold, or silver to form the anode through conductor 20B, which is a direct through conductor. When the anode through conductor side 20B is formed, for example, the inner wall surface of the third through hole is metallized by electroless copper plating, electrolyte copper plating, or the like, which facilitates the processing. Note that the anode through conductor 20B may be formed by filling the third through hole with a metal material, a metal-resin composite material, or the like, instead of metallizing the inner wall surface of the third through hole.

When the resin-filled portion 25A is provided inside the cathode through conductor 20A, a material constituting the resin-filled portion 25A may have a thermal expansion coefficient larger than, smaller than, or equal to that of the material (for example, copper) constituting the cathode through conductor 20A.

When the resin-filled portion 25B is provided inside the anode through conductor 20B, the material constituting the resin-filled portion 25B may have a thermal expansion coefficient larger than, smaller than, or equal to that of the material (for example, copper) constituting the anode through conductor 20B.

The sealing layer 30 is made of an insulating material. In this case, the sealing layer 30 is preferably made of an insulating resin.

Examples of the insulating resin constituting the sealing layer 30 include an epoxy resin and a phenol resin.

The sealing layer 30 preferably further includes a filler.

Examples of the filler contained in the sealing layer 30 include inorganic fillers such as silica particles and alumina particles.

The sealing layer 30 may be constituted by only one layer or may be constituted by two or more layers. When the sealing layer 30 is constituted by two or more layers, the materials constituting the respective layers may be the same as or different from each other.

The sealing layer 30 is formed so as to seal the capacitor portion 10 by, for example, thermally pressure-bonding an insulating resin sheet, applying an insulating resin paste and then thermally curing the insulating resin paste, or the like.

For example, a layer such as a stress relaxation layer or a moisture-proof film may be provided between the capacitor portion 10 and the sealing layer 30.

Examples of a constituent material of the conductive interconnect layer 40A include a metal material containing a metal with a low resistance such as silver, gold, or copper.

In this case, the conductive interconnect layer 40A is formed by plating the surface of the cathode through conductor 20A, for example.

In order to improve close contact between the conductive interconnect layer 40A and another member, that is, close contact between the conductive interconnect layer 40A and the cathode through conductor 20A, a mixed material of at least one type of conductive filler selected from the group consisting of a silver filler, a copper filler, a nickel filler, and a carbon filler and resin may be used as the constituent material of the conductive interconnect layer 40A.

Examples of a constituent material of the conductive interconnect layer 40B include a metal material containing a metal with a low resistance such as silver, gold, or copper. In this case, the conductive interconnect layer 40B is formed by, for example, plating the surface of the anode through conductor 20B.

In order to improve close contact between the conductive interconnect layer 40B and another member, that is, close contact between the conductive interconnect layer 40B and the anode through conductor 20B, a mixed material of at least one type of conductive filler selected from the group consisting of a silver filler, a copper filler, a nickel filler, and a carbon filler and resin may be used as the constituent material of the conductive interconnect layer 40B.

The constituent materials of the conductive interconnect layers 40A and 40B are preferably the same as each other at least in terms of the type, but may be different from each other.

Examples of a constituent material of the via conductor 45 include a metal material containing a metal with a low resistance such as silver, gold, or copper.

The via conductor 45 is formed by, for example, plating the inner wall surface of the through hole penetrating the sealing layer 30 in the thickness direction with the above-described metal material, or filling the through hole with a conductive paste and then performing heat treatment.

Although not illustrated in FIG. 1, the capacitor portion 10 may further include an insulating layer provided around the through conductor 20 on at least one main surface of the anode plate 11.

Additionally, although not illustrated in FIG. 1, the capacitor portion 10 may further include an insulating layer provided on at least one main surface of the anode plate 11 so as to surround the cathode layer 12. Surrounding the periphery of the cathode layer 12 with the insulating layer secures insulation between the anode plate 11 and the cathode layer 12, and prevents a short circuit between the anode plate 11 and the cathode layer 12.

The insulating layer is made of an insulating material. In this case, the insulating layer is preferably made of an insulating resin.

Examples of the insulating resin constituting the insulating layer include a polyphenylsulfone resin, a polyethersulfone resin, a cyanate ester resin, a fluororesin (tetrafluoroethylene, a tetrafluoroethylene-perfluoroalkyl vinyl ether copolymer, or the like), a polyimide resin, a polyamide-imide resin, and an epoxy resin, and a derivative or a precursor of these resins.

The insulating layer may be made of the same resin as that of the sealing layer 30. Unlike the sealing layer 30, the insulating layer is preferably made of a resin-based material containing resin alone because an inorganic filler contained in the insulating layer may adversely affect a portion with an effective capacitance of the capacitor portion 10.

The insulating layer can be formed in a predetermined region by applying a mask material such as a composition containing an insulating resin to the surface of the porous portion 11B by a method such as sponge transfer, screen printing, dispenser coating, or ink-jet printing.

The insulating layer may be formed at the porous portion 11B at a timing before the formation of the dielectric layer 13 or at a timing after the formation of the dielectric layer 13.

Second Embodiment

In a capacitor element according to a second embodiment of the present disclosure, in plan view from a thickness direction of an anode plate, each of a first cathode through conductor and a second cathode through conductor is surrounded by a virtual line constituting a polygon, and a conductive interconnect layer electrically connected to the first anode through conductor is in contact with the virtual line.

Figure 12:
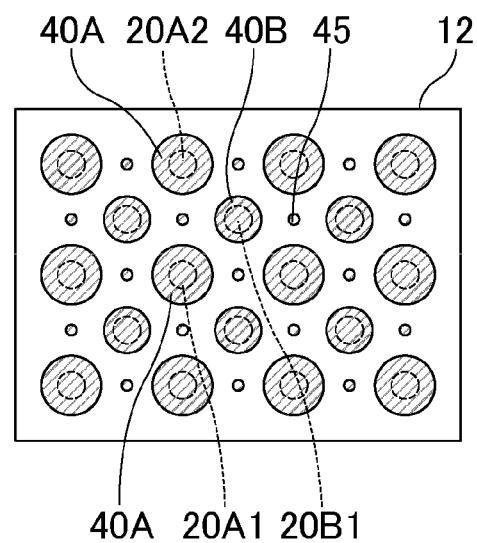
FIG. 12 is a plan view schematically illustrating an example of a capacitor element according to a second embodiment of the present disclosure.
Figure 13:
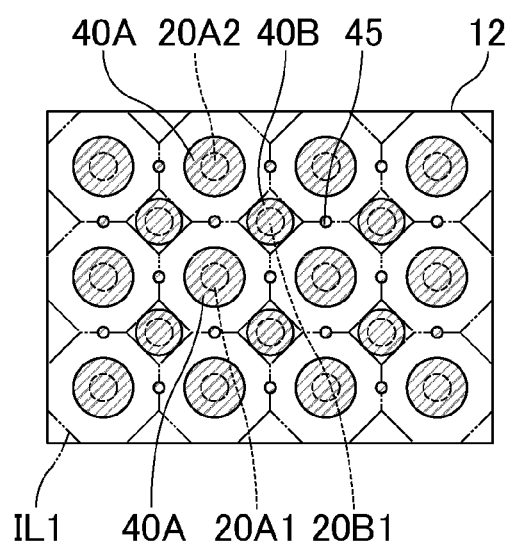
FIG. 13 is a plan view for describing an arrangement of cathode through conductors and anode through conductors in the capacitor element illustrated in FIG. 12.

FIG. 12 is a plan view schematically illustrating an example of the capacitor element according to the second embodiment of the present disclosure. FIG. 13 is a plan view for describing an arrangement of cathode through conductors and anode through conductors in the capacitor element illustrated in FIG. 12.

In the example illustrated in FIG. 12, as illustrated in FIG. 13, in plan view from the thickness direction of the anode plate, each of the first cathode through conductor 20A1 and the second cathode through conductor 20A2 is surrounded by a virtual line IL1 forming a regular octagon, and the conductive interconnect layer 40B electrically connected to the first anode through conductor 20B1 is in contact with the virtual line IL1. As illustrated in FIG. 13, the conductive interconnect layer 40A electrically connected to the first cathode through conductor 20A1 is preferably surrounded by the virtual line IL1 surrounding the first cathode through conductor 20A1, and the conductive interconnect layer 40A electrically connected to the second cathode through conductor 20A2 is preferably surrounded by the virtual line IL1 surrounding the second cathode through conductor 20A2.

In the example illustrated in FIG. 13, the virtual line IL1 surrounding the first cathode through conductor 20A1 shares one side of the regular octagon with the virtual line IL1 surrounding the second cathode through conductor 20A2. The first anode through conductor 20B1 is surrounded by the virtual line IL1 constituting a square.

Figure 14:
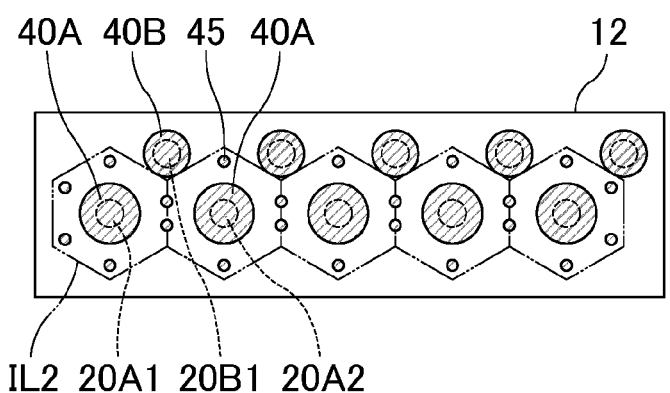
FIG. 14 is a schematic view for describing a first modification of the capacitor element according to the second embodiment of the present disclosure.
Figure 15:
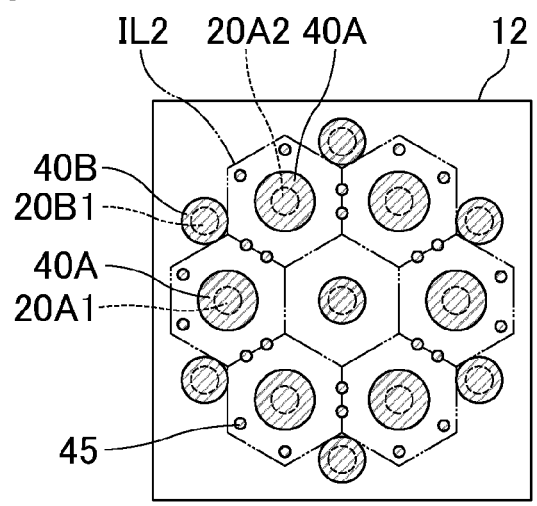
FIG. 15 is a schematic view for describing a second modification of the capacitor element according to the second embodiment of the present disclosure.

FIG. 14 is a schematic view for describing a first modification of the capacitor element according to the second embodiment of the present disclosure. FIG. 15 is a schematic view for describing a second modification of the capacitor element according to the second embodiment of the present disclosure.

In the examples illustrated in FIG. 14 and FIG. 15, in plan view from the thickness direction of the anode plate, each of the first cathode through conductor 20A1 and the second cathode through conductor 20A2 is surrounded by a virtual line IL2 constituting a regular hexagon, and the conductive interconnect layer 40B electrically connected to the first anode through conductor 20B1 is in contact with the virtual line IL2. As illustrated in FIG. 14 and FIG. 15, the conductive interconnect layer 40A electrically connected to the first cathode through conductor 20A1 is preferably surrounded by the virtual line IL2 surrounding the first cathode through conductor 20A1, and the conductive interconnect layer 40A electrically connected to the second cathode through conductor 20A2 is preferably surrounded by the virtual line IL2 surrounding the second cathode through conductor 20A2.

In the examples illustrated in FIG. 14 and FIG. 15, the virtual line IL2 surrounding the first cathode through conductor 20A1 shares one side of the regular hexagon with the virtual line IL2 surrounding the second cathode through conductor 20A2.

As illustrated in FIG. 13, FIG. 14, and FIG. 15, it is preferable that each of the first cathode through conductor 20A1 and the second cathode through conductor 20A2 be surrounded by the virtual line forming a polygon, and the conductive interconnect layer 40B electrically connected to the first anode through conductors 20B1 be in contact with the virtual line in plan view from the thickness direction of the anode plate. In this case, the conductive interconnect layer 40A electrically connected to the first cathode through conductor 20A1 is preferably surrounded by the virtual line surrounding the first cathode through conductor 20A1, and the conductive interconnect layer 40A electrically connected to the second cathode through conductor 20A2 is preferably surrounded by the virtual line surrounding the second cathode through conductor 20A2.

As illustrated in FIG. 13, FIG. 14, and FIG. 15, the virtual line preferably forms a regular polygon such as a regular octagon or a regular hexagon.

As illustrated in FIG. 13, FIG. 14, and FIG. 15, positions of area centroids of the first cathode through conductor 20A1 and the second cathode through conductor 20A2 preferably coincide with positions of area centroids of the polygons formed by the virtual lines.

The virtual line may overlap the outline of the cathode layer 12 in plan view from the thickness direction of the anode plate. In this case, a part of the virtual line may overlap the outline of the cathode layer 12, or the entire virtual line may overlap the outline of the cathode layer 12.

Alternatively, the virtual line does not need to overlap the outline of the cathode layer 12 in plan view from the thickness direction of the anode plate. For example, the outline of the cathode layer 12 may be positioned outside the virtual line, or the outline of the cathode layer 12 may be positioned inside the virtual line.

Figure 16:
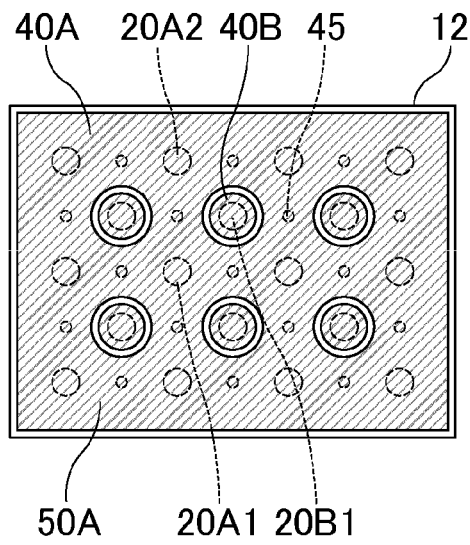
FIG. 16 is a plan view schematically illustrating a modification of the capacitor element illustrated in FIG. 12.

FIG. 16 is a plan view schematically illustrating a modification of the capacitor element illustrated in FIG. 12.

As illustrated in FIG. 16, the conductive interconnect layers 40A electrically connected to the cathode through conductors such as the first cathode through conductor 20A1 and the second cathode through conductor 20A2 may be connected to each other through an interconnect layer 50A. In the example illustrated in FIG. 16, the interconnect layer 50A is provided so as to cover the entire surface of the capacitor portion.

Other Embodiments

A capacitor element according to the present disclosure is not limited to the above-described embodiments, and various applications and modifications can be made within the scope of the present disclosure with respect to the configuration of the capacitor element, the manufacturing conditions of the capacitor element, and the like.

For example, the capacitor element according to the present disclosure may include a plurality of capacitor portions.

When the capacitor element according to the present disclosure includes a plurality of capacitor portions, the number of capacitor portions is not particularly limited as long as the number thereof is two or more. The sizes, the shapes, and the like of the capacitor portions may be the same, or some or all of the sizes, the shapes, and the like of the capacitor portions may be different from each other.

When the capacitor element according to the present disclosure includes a plurality of capacitor portions, the capacitor portions preferably have the same configuration, but may include a capacitor portion having a different configuration from that of the other capacitor portions.

When the capacitor element according to the present disclosure includes a plurality of capacitor portions, the plurality of capacitor portions may be arranged so as to be laminated in a thickness direction, may be arranged so as to be aligned on a plane, or may be arranged such that both of the above-described arrangements are combined with each other.

When the capacitor element according to the present disclosure includes a plurality of capacitor portions arranged in plane, the capacitor element preferably includes a plurality of capacitor portions obtained by dividing one capacitor sheet. In this case, the degree of freedom in arrangement of the capacitor portions is enhanced. Thus, for example, a higher effect can be obtained in terms of the miniaturization of the semiconductor composite device, or the like.

The anode plate may be electrically divided between adjacent capacitor portions. For example, a slit penetrating the capacitor portion in the thickness direction may be formed between adjacent capacitor portions.

Figure 17:
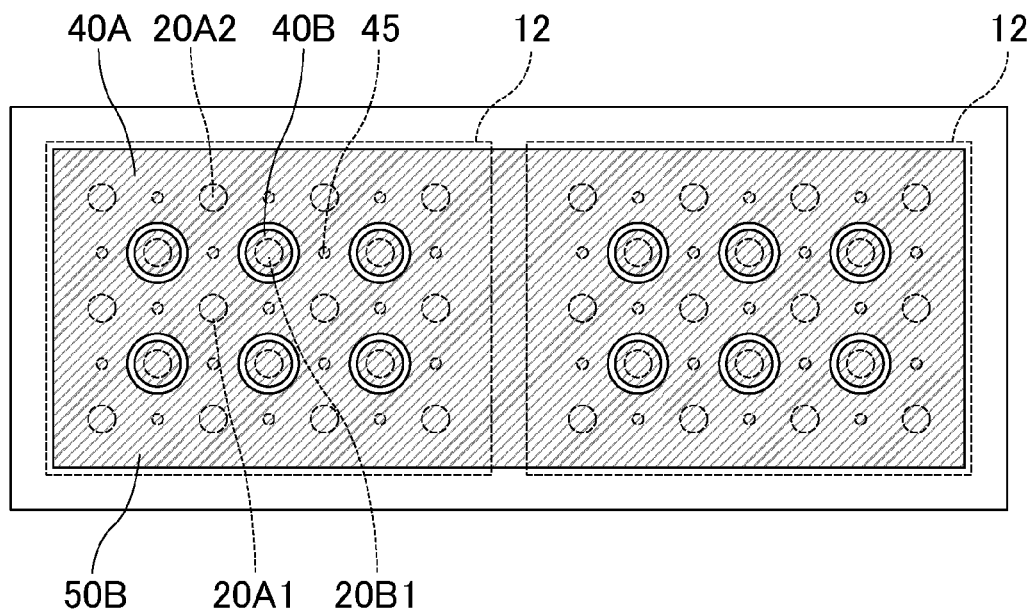
FIG. 17 is a plan view schematically illustrating an example of a capacitor element including a plurality of capacitor portions arranged in plane.

FIG. 17 is a plan view schematically illustrating an example of a capacitor element including a plurality of capacitor portions arranged in plane.

As illustrated in FIG. 17, the conductive interconnect layers 40A electrically connected to the cathode through conductors such as the first cathode through conductor 20A1 and the second cathode through conductor 20A2 may be connected to each other through the interconnect layer 50B between at least one pair of capacitor portions. In the example illustrated in FIG. 17, the interconnect layer 50B is provided so as to cover the entire surface of the capacitor portion.

For example, the anode plate of the capacitor portions may be electrically divided between the capacitor portions in which the conductive interconnect layers 40A are connected to each other. For example, when ground lines are integrated through the interconnect layer 50B between the electrically divided capacitor portions in the semiconductor composite device, an interconnect area occupied by the ground in the interconnect layer 50B positioned in the same layer can be enlarged. Thus, even when a plurality of power supply lines exist, sharing the ground portion allows a loss to be reduced and allows the ground to be strongly dropped. As a result, a noise removal effect is improved.

The capacitor element according to the present disclosure can be suitably used as a constituent material of the composite electronic component. Such a composite electronic component includes, for example, the capacitor element according to the present disclosure, an outer electrode (for example, a conductive interconnect layer) that is provided outside the sealing layer of the capacitor element and that is electrically connected to each of the anode plate and the cathode layer of the capacitor element, and an electronic component connected to the outer electrode.

In the composite electronic component, the electronic component connected to the outer electrode may be a passive element or an active element. Both of the passive element and the active element may be connected to the outer electrode, or either one of the passive element and the active element may be connected to the outer electrode. Alternatively, a composite of the passive element and the active element may be connected to the outer electrode.

Examples of the passive element include an inductor. Examples of the active element include a memory, a graphical processing unit (GPU), a central processing unit (CPU), a micro processing unit (MPU), and a power management IC (PMIC).

The capacitor element according to the present disclosure has a sheet shape as a whole. Thus, in the composite electronic component, the capacitor element can be handled as a mounting substrate, and the electronic component can be mounted on the capacitor element. Furthermore, forming electronic components mounted on the capacitor element in sheet shapes can connect the capacitor element and each of the electronic components in the thickness direction through a through hole conductor penetrating each electronic component in the thickness direction. As a result, the active element and the passive element can be configured as a collective module.

For example, a switching regulator can be formed by electrically connecting the capacitor element according to the present disclosure between a voltage regulator including a semiconductor active element and a load to which a converted DC voltage is supplied.

In the composite electronic component, a circuit layer may be formed on any one of surfaces of a capacitor matrix sheet on which a plurality of capacitor elements according to the present disclosure are further laid out, and the circuit layer may be connected to the passive element or the active element.

Alternatively, after the capacitor element according to the present disclosure is disposed in a cavity portion provided in advance at a substrate, and is embedded with resin, a circuit layer may be formed on the resin. Another electronic component (a passive element or an active element) may be mounted in another cavity portion of the substrate.

Alternatively, after the capacitor element according to the present disclosure is mounted on a smooth carrier such as wafer or glass, and an outer layer portion is made of resin, a circuit layer may be formed, and then the circuit layer may be connected to the passive element or the active element.

The capacitor element according to the present disclosure is used as a module in a semiconductor composite device that supplies a load with a DC voltage adjusted by a voltage regulator including a semiconductor active element, for example. A module including the capacitor element according to the present disclosure is also one aspect of the present disclosure. Furthermore, a semiconductor composite device including the module is also one aspect of the present disclosure.

Figure 18:
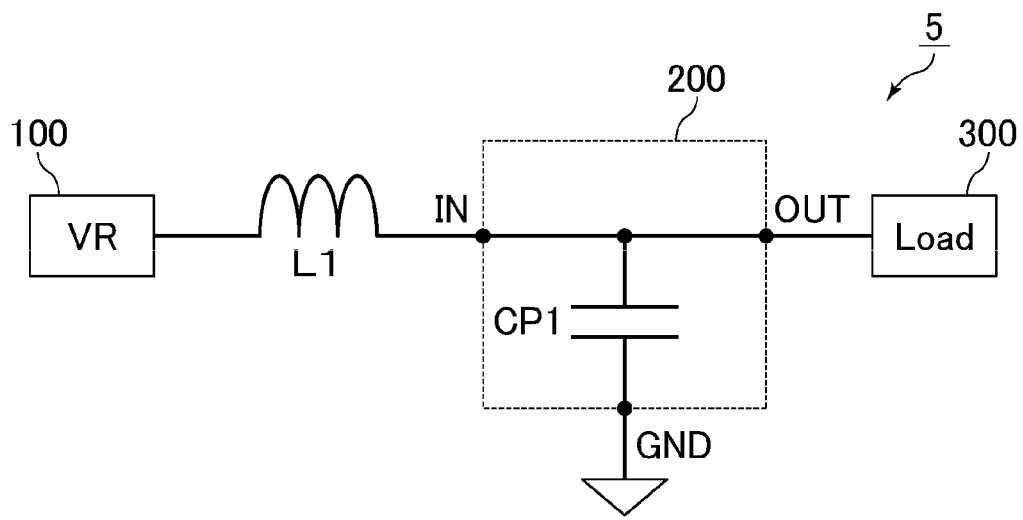
FIG. 18 is a block diagram illustrating an example of a semiconductor composite device to be used in the present disclosure.

FIG. 18 is a block diagram illustrating an example of the semiconductor composite device to be used in the present disclosure.

A semiconductor composite device 5 illustrated in FIG. 18 includes a voltage regulator (VR) 100, a module 200, and a load 300.

The voltage regulator 100 includes an active element (not illustrated) such as a semiconductor switching element. The voltage regulator 100 adjusts a DC voltage to be supplied from the outside to a voltage level suitable for the load 300 by controlling a duty of the active element.

A capacitor CP1 is formed inside the module 200.

As in the semiconductor composite device 5 illustrated in FIG. 18, an inductor L1 may be disposed between the voltage regulator 100 and the module 200. Alternatively, the inductor L1 may be formed inside the module 200.

In the semiconductor composite device 5 illustrated in FIG. 18, the inductor L1 is disposed between an input terminal IN of the module 200 and the voltage regulator 100. The capacitor CP1 is connected between a middle of an output terminal OUT and an input terminal IN and a ground terminal GND. The voltage regulator 100, the inductor L1, and the capacitor CP1 in the module 200 form a chopper type step-down switching regulator. The inductor L1 and the capacitor CP1 function as a ripple filter of the step-down switching regulator. For example, the switching regulator steps down a DC voltage of 5 V input from the outside to 1 V to supply the stepped-down DC voltage to the load 300.

The load 300 is, for example, a semiconductor integrated circuit (IC) such as a logical operation circuit or a memory circuit.

The semiconductor composite device 5 may include electronic devices such as a decoupling capacitor for noise suppression, a choke inductor, a diode element for surge protection, and a resistance element for voltage division, in addition to the voltage regulator 100, the module 200, and the load 300.

In the above description, the example in which the present disclosure is applied to the chopper type step-down switching regulator has been described, but the present disclosure can be also applied to a semiconductor composite device in which a power transmission line including another type of step-up/down circuit is systemized.

Figure 19:
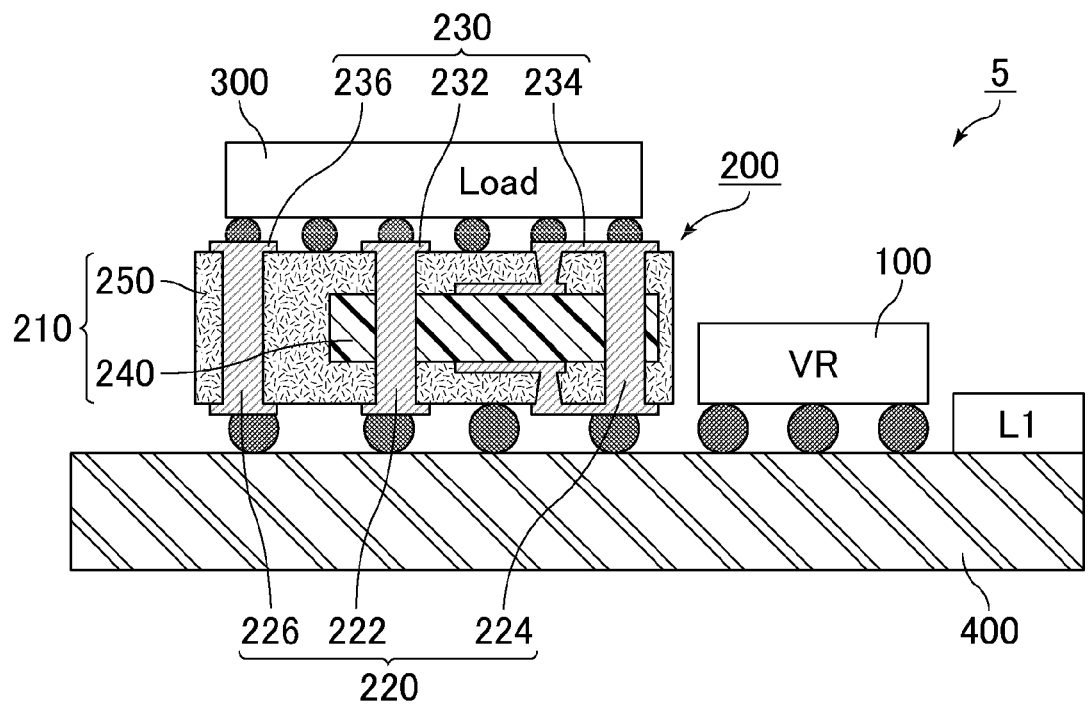
FIG. 19 is a cross-sectional view schematically illustrating an example of the semiconductor composite device illustrated in FIG. 18.

FIG. 19 is a cross-sectional view schematically illustrating an example of the semiconductor composite device illustrated in FIG. 18.

As an example of the semiconductor composite device 5 illustrated in FIG. 18, the module 200 electrically connected to the load 300 may be mounted on a mother board 400 as illustrated in FIG. 19. In the example illustrated in FIG. 19, the voltage regulator 100 and the inductor L1 are further mounted on the mother board 400. Thus, a power supply line passing through the voltage regulator 100 is electrically connected to the load 300 via the module 200.

The module 200 includes a capacitor layer 210 that forms the capacitor CP1 (see FIG. 18), a through conductor 220, and a connection terminal layer 230. When the inductor L1 is formed inside the module 200, the module 200 may further include an inductor layer forming the inductor L1.

The capacitor layer 210 includes a capacitor portion 240. As illustrated in FIG. 19, the capacitor layer 210 preferably further includes a sealing layer 250 on a surface of the capacitor portion 240. The capacitor layer 210 and the through conductor 220 constitute a capacitor element.

The through conductor 220 is provided so as to penetrate the capacitor portion 240 in the thickness direction of the capacitor layer 210 (a vertical direction in FIG. 19). The through conductor 220 is used for electrical connection between the capacitor portion 240 and at least one of the voltage regulator 100 and the load 300.

The through conductor 220 includes a first through conductor (anode through conductor) 222 electrically connected to the anode plate of the capacitor portion 240 and a second through conductor (cathode through conductor) 224 electrically connected to the cathode layer of the capacitor portion 240. As illustrated in FIG. 19, the through conductor 220 may include a third through conductor 226 that is not electrically connected to any of the anode plate and the cathode layer of the capacitor portion 240.

The through conductor 220 is classified into A: a through conductor for an anode of a capacitor, B: a through conductor for a cathode of a capacitor and a ground, and C: a through conductor for an I/O line. A: the through conductor 220 for the anode of the capacitor is electrically connected to the anode plate of the capacitor portion 240, B: the through conductor 220 for the cathode of the capacitor and the ground is electrically connected to the cathode layer of the capacitor portion 240, and C: the through conductor 220 for the I/O line is electrically connected to neither the anode plate nor the cathode layer of the capacitor portion 240.

A: the through conductor 220 for the anode of the capacitor may or does not need to be filled with an insulating material between the through conductor 220 and the through hole that penetrates the capacitor portion 240. In the latter case, the anode of the capacitor portion 240 and the through conductor 220 are directly connected to each other. B: the through conductor 220 for the cathode of the capacitor and the ground and C: the through conductor 220 for the I/O line are formed by filling an insulating material between the through conductor 220 and the through hole penetrating the capacitor portion 240.

For example, a first through conductor 222 corresponds to A: the through conductor 220 for the anode of the capacitor, a second through conductor 224 corresponds to B: the through conductor 220 for the cathode of the capacitor and the ground, and a third through conductor 226 corresponds to C: the through conductor 220 for the I/O line.

The connection terminal layer 230 is electrically connected to the through conductor 220. The connection terminal layer 230 is used for electrical connection between the capacitor portion 240 and at least one of the voltage regulator 100 and the load 300. In the example illustrated in FIG. 19, of the connection terminal layer 230, a connection terminal layer 232 is electrically connected to the first through conductor 222, a connection terminal layer 234 is electrically connected to the second through conductor 224, and a connection terminal layer 236 is electrically connected to the third through conductor 226.

The connection terminal layer 230 functions as a connection terminal. The connection terminal layer 230 includes the input terminal IN, the output terminal OUT, and the ground terminal GND that have been described above. The connection terminal layer 230 is mainly made of a metal with a low resistance such as silver, gold, or copper. In this case, the connection terminal layer 230 is formed by, for example, plating the surface of the through conductor 220. Note that the connection terminal layer 230 may include an interconnect line that forms a circuit in addition to the terminals. Additionally, the connection terminal layer 230 may be constituted by a plurality of layers.

When the capacitor layer 210 includes the sealing layer 250, the sealing layer 250 is provided so as to cover the capacitor portion 240. The sealing layer 250 may be provided so as to cover the capacitor portion 240 from both main surface sides, or may be provided so as to cover the capacitor portion 240 from any one of the main surface sides.

The module according to the present disclosure may be built in a wiring board. When the module according to the present disclosure is built in the wiring board, a mounting area can be reduced.

The module according to the present disclosure may be used as an interposer for a load, an inductor or a semiconductor active element.

REFERENCE SIGNS LIST

1 CAPACITOR ELEMENT
5 SEMICONDUCTOR COMPOSITE DEVICE
10 CAPACITOR PORTION
11 ANODE PLATE
11A CORE PORTION
11B POROUS PORTION
12 CATHODE LAYER
13 DIELECTRIC LAYER
20 THROUGH CONDUCTOR
20A CATHODE THROUGH CONDUCTOR
20A1 FIRST CATHODE THROUGH CONDUCTOR
20A2 SECOND CATHODE THROUGH CONDUCTOR
20A3 THIRD CATHODE THROUGH CONDUCTOR
20A4 FOURTH CATHODE THROUGH CONDUCTOR
20B ANODE THROUGH CONDUCTOR
20B1 FIRST ANODE THROUGH CONDUCTOR
20B2 SECOND ANODE THROUGH CONDUCTOR
20B3 THIRD ANODE THROUGH CONDUCTOR
20B4 FOURTH ANODE THROUGH CONDUCTOR
25A, 25B RESIN-FILLED PORTION
30 SEALING LAYER
40A, 40B CONDUCTIVE INTERCONNECT LAYER
45 VIA CONDUCTOR
50A, 50B INTERCONNECT LAYER
100 VOLTAGE REGULATOR
200 MODULE
210 CAPACITOR LAYER
220 THROUGH CONDUCTOR
222 FIRST THROUGH CONDUCTOR
224 SECOND THROUGH CONDUCTOR
226 THIRD THROUGH CONDUCTOR
230, 232, 234, 236 CONNECTION TERMINAL LAYER
240 CAPACITOR PORTION
250 SEALING LAYER
300 LOAD
400 MOTHER BOARD
CP1 CAPACITOR
GND GROUND TERMINAL
IL1, IL2 VIRTUAL LINE
IN INPUT TERMINAL
L1 INDUCTOR
OUT OUTPUT TERMINAL

The invention claimed is:

1. A capacitor element comprising:
a capacitor portion including an anode plate having a porous portion on at least one main surface of a core portion, a dielectric layer on a surface of the porous portion, and a cathode layer on a surface of the dielectric layer;
a first cathode through conductor penetrating the dielectric layer and the anode plate in a thickness direction and electrically connected to the cathode layer;
a second cathode through conductor penetrating the dielectric layer and the anode plate in a thickness direction and electrically connected to the cathode layer; and
an anode through conductor penetrating the dielectric layer and the anode plate in the thickness direction and electrically connected to the anode plate,
wherein, in a plan view from a thickness direction of the anode plate, a first center-to-center distance between the first anode through conductor and the first cathode through conductor is equivalent to a second center-to-center distance between the first anode through conductor and the second cathode through conductor.

2. The capacitor element according to claim 1, further comprising:
at least a single third cathode through conductor,
wherein a third center-to-center distance between the first cathode through conductor and the second cathode through conductor is equivalent to a fourth center-to-center distance between the first cathode through conductor and the third cathode through conductor in the plan view.

3. The capacitor element according to claim 2, wherein the third cathode through conductor is present on a straight line obtained by rotating a line segment connecting a center of the first cathode through conductor and a center of the second cathode through conductor by an angle of 60 degrees, 90 degrees, 120 degrees, or 180 degrees with the center of the first cathode through conductor serving as a reference in the plan view.

4. The capacitor element according to claim 2, wherein the third cathode through conductor is present on a straight line obtained by rotating a line segment connecting a center of the first cathode through conductor and a center of the second cathode through conductor by an angle of 90 degrees or 180 degrees with the center of the first cathode through conductor serving as a reference in the plan view.

5. The capacitor element according to claim 2, wherein the third cathode through conductor is present on a straight line obtained by rotating a line segment connecting a center of the first cathode through conductor and a center of the second cathode through conductor by an angle of 60 degrees or 120 degrees with the center of the first cathode through conductor serving as a reference in the plan view.

6. The capacitor element according to claim 1, further comprising:
a second anode through conductor, wherein
the first center-to-center distance between the first cathode through conductor and the first anode through conductor is equivalent to a third center-to-center distance between the first cathode through conductor and the second anode through conductor in the plan view.

7. The capacitor element according to claim 6, further comprising:
at least a single third anode through conductor, wherein
a fourth center-to-center distance between the first anode through conductor and the second anode through conductor is equivalent to a fifth center-to-center distance between the first anode through conductor and the third anode through conductor in the plan view.

8. The capacitor element according to claim 7, wherein the third anode through conductor is present on a straight line obtained by rotating a line segment connecting a center of the first anode through conductor and a center of the second anode through conductor by an angle of 60 degrees, 90 degrees, 120 degrees, or 180 degrees with the center of the first anode through conductor serving as a reference in the plan view.

9. The capacitor element according to claim 7, wherein the third anode through conductor is present on a straight line obtained by rotating a line segment connecting a center of the first anode through conductor and a center of the second anode through conductor by an angle of 90 degrees or 180 degrees with the center of the first anode through conductor serving as a reference in the plan view.

10. The capacitor element according to claim 7, wherein the third anode through conductor is present on a straight line obtained by rotating a line segment connecting a center of the first anode through conductor and a center of the second anode through conductor by an angle of 60 degrees or 120 degrees with the center of the first anode through conductor serving as a reference in the plan view.

11. The capacitor element according to claim 2, further comprising:
at least a single fourth cathode through conductor, wherein
in the plan view, the third center-to-center distance between the second cathode through conductor and the first cathode through conductor is equivalent to a fifth center-to-center distance between the second cathode through conductor and the fourth cathode through conductor.

12. The capacitor element according to claim 11, wherein, in the plan view, a first number of anode through conductors existing inside a first circle having a radius equal to the third center-to-center distance between the first cathode through conductor and the second cathode through conductor, the first circle having a center equal to a center of the first cathode through conductor, is equal to a second number of anode through conductors existing inside a second circle having the radius equal to the third center-to-center distance between the first cathode through conductor and the second cathode through conductor, the second circle having a center equal to a center of the second cathode through conductor.

13. The capacitor element according to claim 12, wherein, in the plan view, a difference between a first total area of the anode through conductors overlapping the first circle and a second total area of the anode through conductors existing inside the second circle is within ±5%.

14. The capacitor element according to claim 12, wherein the capacitor element includes two or more of the third cathode through conductors and two or more of the fourth cathode through conductors.

15. The capacitor element according to claim 7, further comprising:
at least a single fourth anode through conductor, wherein
in the plan view, the fourth center-to-center distance between the second anode through conductor and the first anode through conductor is equivalent to a sixth center-to-center distance between the second anode through conductor and the fourth anode through conductor.

16. The capacitor element according to claim 15, wherein in the plan view, a first number of the cathode through conductors existing inside a first circle having a radius equal to the fourth center-to-center distance between the first anode through conductor and the second anode through conductor, the first circle having a center equal to a center of the first anode through conductor, is equal to a second number of the cathode through conductors existing inside a second circle having the radius equal to the fourth center-to-center distance between the first anode through conductor and the second anode through conductor, the second circle having a center equal to a center of the second anode through conductor.

17. The capacitor element according to claim 16, wherein in the plan view, a difference between a first total area of the cathode through conductors overlapping the first circle and a second total area of the cathode through conductors existing inside the second circle is within ±5%.

18. The capacitor element according to claim 16, wherein the capacitor element includes two or more of the third anode through conductors and two or more of the fourth anode through conductors.

19. The capacitor element according to claim 1, further comprising:
a sealing layer covering the capacitor portion; and
a conductive interconnect layer on a surface of the sealing layer, the conductive interconnect layer being electrically connected to one of the cathode through conductor and the anode through conductor,
wherein each of the first cathode through conductor, the second cathode through conductor, and the first anode through conductor penetrates the sealing layer and the capacitor portion in the thickness direction, and is connected, at an end portion thereof, to the conductive interconnect layer.

20. The capacitor element according to claim 19, wherein, in the plan view, each of the first cathode through conductor and the second cathode through conductor is surrounded by a virtual line constituting a polygon, and the conductive interconnect layer electrically connected to the first anode through conductor is in contact with the virtual line.

21. The capacitor element according to claim 20, wherein the virtual line forms a regular polygon.

22. The capacitor element according to claim 20, wherein, in the plan view, the conductive interconnect layer electrically connected to the first cathode through conductor is surrounded by the virtual line surrounding the first cathode through conductor, and the conductive interconnect layer electrically connected to the second cathode through conductor is surrounded by the virtual line surrounding the second cathode through conductor.

23. The capacitor element according to claim 20, wherein each of positions of area centroids of the first cathode through conductor and the second cathode through conductor coincides with a position of an area centroid of the polygon formed by the virtual line.

24. A module configured to be used in a semiconductor composite device configured to supply a load with a DC voltage adjusted by a voltage regulator including a semiconductor active element, the module comprising:
   the capacitor element according to claim 1,
   wherein at least one of the first cathode through conductor, the second cathode through conductor, or the anode through conductor connects the capacitor element and at least one of the voltage regulator and the load.

25. A semiconductor composite device configured to convert an input DC voltage into a DC voltage different from the input DC voltage, the semiconductor composite device comprising:
   a voltage regulator including a semiconductor active element;
   the module according to claim 24; and
   a load to which the converted DC voltage is supplied.

* * * * *